(12) United States Patent
Ranish et al.

(10) Patent No.: US 9,929,027 B2
(45) Date of Patent: Mar. 27, 2018

(54) EASY ACCESS LAMPHEAD

(71) Applicant: Applied Materials, Inc., Santa Clara, CA (US)

(72) Inventors: Joseph M. Ranish, San Jose, CA (US); Oleg Serebryanov, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 659 days.

(21) Appl. No.: 14/507,304

(22) Filed: Oct. 6, 2014

(65) Prior Publication Data

US 2015/0147053 A1    May 28, 2015

Related U.S. Application Data

(60) Provisional application No. 61/937,956, filed on Feb. 10, 2014, provisional application No. 61/907,847, filed on Nov. 22, 2013.

(51) Int. Cl.
| | | |
|---|---|---|
| *F26B 3/30* | (2006.01) | |
| *F26B 19/00* | (2006.01) | |
| *A21B 2/00* | (2006.01) | |
| *H01L 21/67* | (2006.01) | |
| *H05B 3/00* | (2006.01) | |

(52) U.S. Cl.
CPC ...... *H01L 21/67115* (2013.01); *H05B 3/0047* (2013.01)

(58) Field of Classification Search
None
See application file for complete search history.

(56) References Cited

U.S. PATENT DOCUMENTS

| | | | | |
|---|---|---|---|---|
| 3,859,554 A | | 1/1975 | Preziosi et al. | |
| 5,155,336 A | * | 10/1992 | Gronet | C23C 16/481 219/390 |
| 5,268,989 A | * | 12/1993 | Moslehi | H01L 21/67115 118/725 |
| 5,397,963 A | | 3/1995 | Manson | |
| 5,446,825 A | * | 8/1995 | Moslehi | C23C 16/481 118/724 |
| 5,683,518 A | * | 11/1997 | Moore | C23C 16/4404 118/50.1 |
| 5,740,314 A | * | 4/1998 | Grimm | B29C 35/08 219/405 |
| 5,781,693 A | | 7/1998 | Ballance et al. | |

(Continued)

FOREIGN PATENT DOCUMENTS

JP    2001-291677 A    10/2001

OTHER PUBLICATIONS

International Search Report and Written Opinion for International Application No. PCT/US14/59337 dated Jan. 19, 2015.

*Primary Examiner* — Thor Campbell
(74) *Attorney, Agent, or Firm* — Patterson + Sheridan LLP

(57) ABSTRACT

Embodiments described herein generally relate to an improved power distribution assembly for a lamphead assembly used in a thermal processing chamber. In one embodiment, the lamphead assembly includes a plurality of lamps for thermal processing of semiconductor substrates, and a power distribution assembly having a plurality of openings, the power distribution assembly provides power to the plurality of lamps, and each opening is sized to allow passage of the lamp therethough.

20 Claims, 20 Drawing Sheets

(56) References Cited

U.S. PATENT DOCUMENTS

| | | | |
|---|---|---|---|
| 5,889,258 A * | 3/1999 | Lubomirski | H05B 3/0047 219/390 |
| 5,952,832 A | 9/1999 | Stevanovic et al. | |
| 6,121,579 A * | 9/2000 | Aoki | C23C 16/481 118/730 |
| 6,167,195 A * | 12/2000 | Moslehi | C23C 16/481 118/724 |
| 6,337,544 B1 | 1/2002 | Wang et al. | |
| 6,350,964 B1 * | 2/2002 | Boas | H01L 21/67115 118/724 |
| 6,392,352 B1 | 5/2002 | Walters et al. | |
| 6,476,362 B1 * | 11/2002 | Deacon | H01L 21/67115 118/50.1 |
| 6,784,667 B2 | 8/2004 | Belenger et al. | |
| 6,805,466 B1 * | 10/2004 | Ranish | H01L 21/67115 219/405 |
| 6,837,589 B2 * | 1/2005 | Nam | H01L 21/67109 118/725 |
| 6,947,665 B2 * | 9/2005 | Garmer | H01L 21/67115 392/411 |
| 7,109,668 B2 | 9/2006 | Pogodayev et al. | |
| 7,147,359 B2 * | 12/2006 | Ranish | F27B 17/0025 362/278 |
| 7,173,216 B2 | 2/2007 | Ptak | |
| 7,923,933 B2 | 4/2011 | Serebryanov et al. | |
| 8,294,068 B2 * | 10/2012 | Ranish | F27B 17/0025 118/50.1 |
| 8,314,368 B2 * | 11/2012 | Ranish | H01L 21/324 118/725 |
| 8,698,049 B2 * | 4/2014 | Ranish | F27B 17/0025 118/50.1 |
| 2003/0029859 A1 | 2/2003 | Knoot et al. | |
| 2005/0118737 A1 | 6/2005 | Takagi et al. | |
| 2005/0286243 A1 | 12/2005 | Ranish et al. | |
| 2006/0038661 A1 | 2/2006 | Reinhold et al. | |
| 2006/0066193 A1 | 3/2006 | Ranish et al. | |
| 2006/0086713 A1 | 4/2006 | Hunter et al. | |
| 2010/0111511 A1 | 5/2010 | Merry et al. | |
| 2011/0133742 A1 | 6/2011 | Serebryanov et al. | |
| 2011/0308551 A1 * | 12/2011 | Chung | B08B 5/00 134/22.1 |
| 2014/0255013 A1 * | 9/2014 | Ranish | H01L 21/67115 392/411 |

* cited by examiner

EASY ACCESS LAMPHEAD

CROSS-REFERENCE TO RELATED APPLICATIONS

This application is related to U.S. provisional patent application Ser. No. 61/907,847, filed Nov. 22, 2013, and 61/937,956, filed Feb. 10, 2014, which are herein incorporated by reference.

BACKGROUND

Field

Embodiments of the present disclosure generally relate to an apparatus for heating substrates and, more specifically, to an apparatus having an improved lamphead system with a lamp failure detector.

Description of the Related Art

Conventional lateral flow chambers may have an upper dome, a lower dome, a substrate support disposed between the upper dome and the lower dome, and a lamphead positioned under and in close proximity to the lower dome. A number of lamps are located in the lamphead and facing the back side of the substrate support. The lamps contained in the lamphead are divided into multiple, radially symmetric zones. Each zone contains multiple lamps, and the lamps are divided into pairs with each lamp pair connected to a power driver. During processing, heat radiation from the lamps radiate through the lower dome onto a rotating substrate positioned on the substrate support. In this manner, the substrate is heated to a required processing temperature.

When a lamp fails and needs to be replaced, the entire lamphead must be dropped manually in order to retrieve the faulty lamp from its receptacle from the top of the lamphead. As the lamphead is positioned in close proximity to the lower dome, disassembly of the entire lamphead to replace the faulty lamp in such a limited space requires extra effort and time, which causes longer change times and therefore slower process throughput. In addition, variation in lamp intensity due to lamp failure or poor performance can greatly compromise the desired heating temperature profile control and result in unacceptable process results. If one of the lamp filaments breaks, the conventional lamp failure detection system cannot detect which lamp in a pair has the open filament since the failure detection method measures current for two lamps connected in series. As a result, it is necessary to check both lamps for failure if a failure state is indicated for the lamp pair. Also, the lamps for a given pair are often located at some distance apart within the lamphead to minimize the impact to radiation uniformity should one of the lamps fail during substrate processing. Significant time could be saved if only the failed lamp had to be located within the lamp array, resulting in decreased down time for the lateral flow chambers.

Thus, there is a need in the art for an improved apparatus which enables fast lamp replacement, ease of service of the lamphead, and lamp failure detection.

SUMMARY

Embodiments described herein generally relate to an improved power distribution assembly for a lamphead assembly for use in a thermal processing chamber. In one embodiment, a lamphead assembly is provided. The lamphead assembly includes a plurality of lamps for thermal processing of semiconductor substrates, and a power distribution assembly having a plurality of openings, the power distribution assembly provides power to the plurality of lamps, and each opening is sized to allow passage of the lamp therethough.

In another embodiment, a processing chamber is provided. The processing chamber includes a chamber body having an upper dome and a lower dome opposing the upper dome, a substrate support disposed within the chamber body, a lamphead assembly positioned adjacent to the lower dome, wherein the lamphead assembly has a plurality of lamps, and a power distribution assembly coupled to the lamphead assembly to provide power to the plurality of lamps, wherein the power distribution assembly has a plurality of openings each sized to allow passage of the lamp therethough.

In yet another embodiment, the processing chamber includes a lamphead assembly having a plurality of lamps for thermal processing of semiconductor substrates, wherein each of the plurality of lamps has electrical contact terminals, a power distribution assembly coupled to the lamphead assembly, wherein the power distribution assembly provides power to the plurality of lamps and has a plurality of openings each sized to allow passage of the lamp therethough, a voltage data acquisition (DAQ) module configured to sample voltage signals at different sampling locations along a circuit path formed by a group of serially connected lamps in the plurality of lamps, and a controller configured to receive digital values of the sampled voltage signals from the voltage DAQ module, the controller detects a failure in one or more of the lamps based on voltage drops across at least two of the lamps, as determined by the sampled voltage signals.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to an improved power distribution assembly for a lamphead assembly for use in a thermal processing chamber. The thermal processing chamber generally includes an upper dome, a lower dome, a substrate support disposed between the upper dome and the lower dome, and a lamphead assembly positioned under and in close proximity to the lower dome. A plurality of lamps are positioned within their respective receptacles in the lamphead assembly to provide radiant energy through the optically transparent lower dome to a substrate positioned on the substrate support. The lamphead assembly is in electrical communication with a power distribution assembly, through which power is supplied to each lamp. The power distribution assembly may be a single flat circuitry board or consisted of multiple concentric ring-type circuitry boards configured in a stepped staircase fashion in accordance with the angle of the lower dome. The power distribution assembly has a plurality of openings each sized to allow the passage of a lamp therethrough for fast lamp replacement and ease of service of the lamphead assembly.

Exemplary Thermal Processing Chamber

Figure 1:
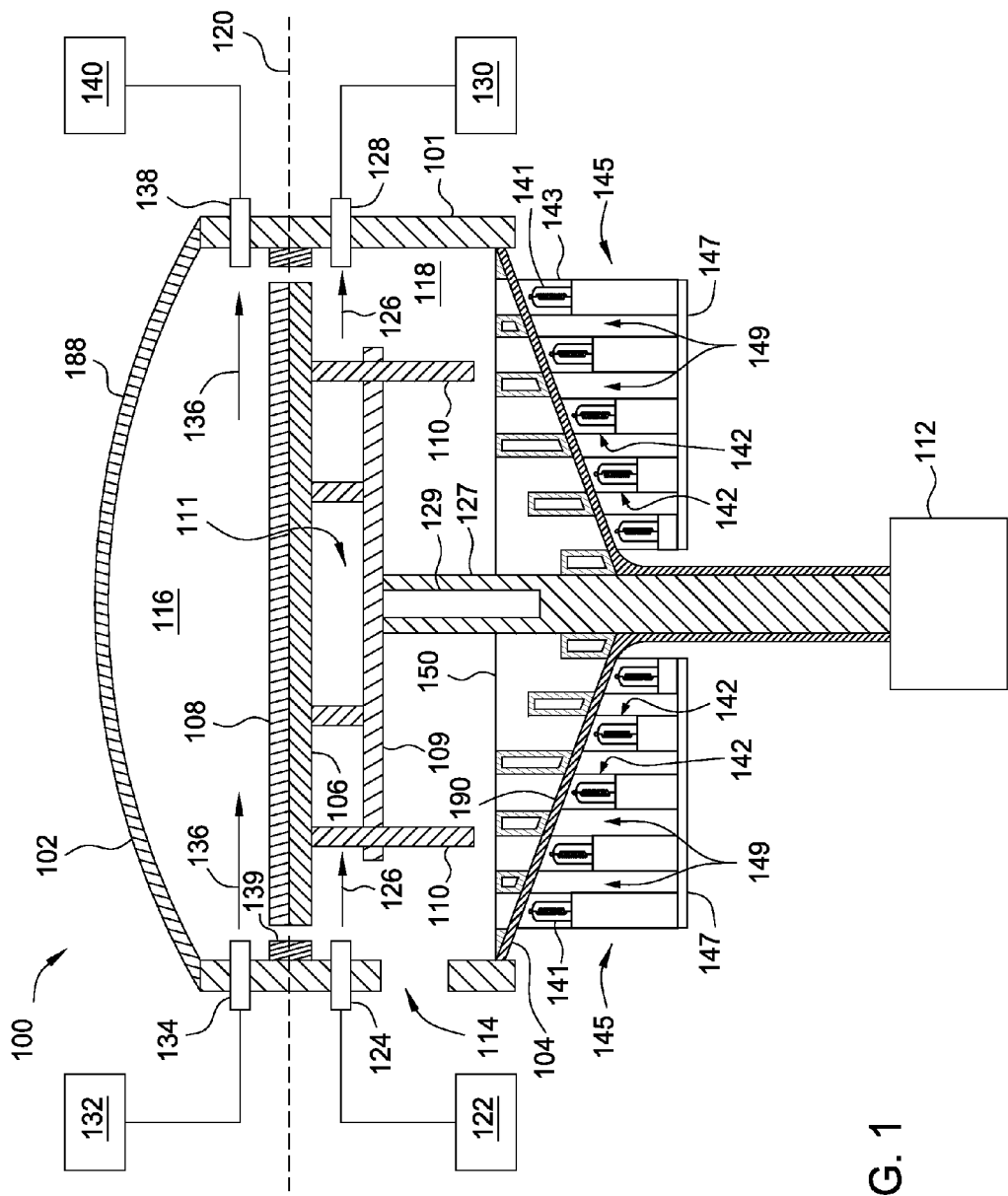
FIG. 1 is a schematic sectional view of a thermal processing chamber.

FIG. 1 is a schematic sectional view of a thermal processing chamber 100. The processing chamber 100 may be used to process one or more substrates, including the deposition of a material on an upper surface of a substrate. The processing chamber 100 includes a chamber body 101, an upper dome 102, and a lower dome 104 generally define an internal region of the processing chamber 100. The upper dome 102 may be formed from a material such as a stainless steel, aluminum, quartz, or coated metals or ceramics, while the lower dome 104 may be formed from an optically transparent material such as quartz. The lower dome 104 is coupled to, or is an integral part of, the chamber body 101. A substrate support 106 adapted to support a substrate 108 thereon is disposed within the processing chamber 100 between the upper dome 102 and the lower dome 104. The substrate support 106 is coupled to a support plate 109 and forms a gap 111 therebetween. The thickness and the degree of curvature of the upper dome 102 and the lower dome 104 may be configured to provide a flatter geometry for uniform flow uniformity in the processing chamber 100. For example, the central portion 188 of the upper dome 102 may form an angle of about 8° to about 22° with respect to a horizontal plane defining a substrate receiving surface of the substrate support 106. Similarly, the bottom 190 of the lower dome 104 may be at an angle of about 8° to about 22° with respect to a horizontal plane defining a substrate receiving surface of the substrate support 106.

The support plate 109 may be formed from an optically transparent material, such as quartz, to allow radiant energy from lamps 142 to impinge upon and heat the substrate support 106 to a desired processing temperature. The substrate support 106 is formed from silicon carbide or graphite coated with silicon carbide to absorb radiant energy from the lamps 142 and transport the radiant energy to the substrate 108. The substrate support 106 is shown in an elevated processing position, but may be vertically actuated by an actuator 112 to a loading position below the processing position to allow lift pins 110 to contact the lower dome 104 and raise the substrate 108 from the substrate support 106. A robot transfer blade (not shown) may then enter the processing chamber 100 to engage and remove the substrate 108 therefrom through an opening 114, such as a slit valve. The substrate support 106 is also adapted to be rotated during processing by the actuator 112 to facilitate uniform processing of the substrate 108.

The substrate support 106, while located in the processing position, divides the internal volume of the processing chamber 100 into a process gas region 116 and a purge gas region 118. The process gas region 116 includes the internal chamber volume located between the upper dome 102 and a plane 120 of the substrate support 106 while the substrate support 106 is located in the processing position. The purge gas region 118 includes the internal chamber volume located between the lower dome 104 and the plane 120.

Process gas supplied from a process gas supply source 132 is introduced into the process gas region 116 through a process gas inlet 134 formed in a sidewall of the chamber body 101. The process gas flows laterally across the upper surface of the substrate 108 along flow path 136. The process gas exits the process gas region 116 through a process gas outlet 138 located on the side of the processing chamber 100 opposite the process gas inlet 134. Removal of the process gas through the process gas outlet 138 is facilitated by a vacuum pump 140 coupled thereto. The process gas inlet 134 and the process gas outlet 138 are aligned to each other and disposed approximately at the same elevation to enable a generally planar, uniform gas flow across the substrate 108.

Purge gas supplied from a purge gas source 122 is introduced to the purge gas region 118 through a purge gas inlet 124 formed within a sidewall of the chamber body 101. The purge gas flows laterally along flow path 126 across the back surface of the support 106, and is exhausted from the purge gas region 118 through a purge gas outlet 128 located on the side of the processing chamber 100 opposite the purge gas inlet 124. An exhaust pump 130, coupled to the purge gas outlet 128, facilitates removal of the purge gas from the purge gas region 118. The flowing of the purge gas is believed to prevent or substantially avoid the flow of the process gas from entering into the purge gas region 118, or to reduce diffusion of the process gas entering the purge gas region 118.

A plurality of lamps 142 are disposed adjacent to and beneath the lower dome 104 to heat the substrate 108 as the process gas passes thereover to facilitate the deposition of a material onto the upper surface of the substrate 108. In one embodiment, the lamps 142 may be positioned approximately 1 mm to about 40 mm from the lower dome 104. The lamps include bulbs 141 surrounded by an optional reflector 143. Each lamp 142 is coupled to a power distribution assembly 147 through which power is supplied to each lamp 142. The lamps 142 are arranged in annular groups of increasing radius around a shaft 127 of the substrate support 106. The shaft 127 is formed form quartz and contains a hollow portion or cavity 129 therein, which reduces lateral displacement of radiant energy near the center of the substrate 108, thus facilitating uniform irradiation of the substrate 108.

The lamps 142 are adapted to heat the substrate to a predetermined temperature to facilitate thermal decomposition of the process gas onto the surface of the substrate 108. In one example, the material deposited onto the substrate may be a group III, group IV, and/or group V material, or may be a material including a group III, group IV, and/or group V dopant. For example, the deposited material may include gallium arsenide, gallium nitride, or aluminum gallium nitride. The lamps may be adapted to heat the substrate to a temperature within a range of about 300 degrees Celsius to about 1200 degrees Celsius, such as about 300 degrees Celsius to about 950 degrees Celsius. A light focusing assembly 150 may optionally be positioned above and in contact with the lower dome 104 to controllably direct radiant energy from the lamps 142 to the substrate support 106, thus resulting in a more uniform deposition on the substrate 108. The uniform deposition on the substrate 108 results in a higher quality substrate and a more efficient manufactured device.

One or more lamps 142 are positioned within in a lamphead assembly 145 which may be cooled during or after processing by a cooling fluid introduced into channels 149 located between the lamps 142. The lamphead assembly 145 conductively cools the lower dome 104 due in part to the close proximity of the lamphead assembly 145 to the lower dome 104. The lamphead assembly 145 also cools the lamp walls and walls of the reflectors 143 as well.

Although FIG. 1 illustrates one embodiment of a processing chamber, additional embodiments are also contemplated and can be applied to various embodiments discussed in this disclosure. For example, in some embodiments, it is contemplated that the substrate support 106 may be formed from an optically transparent material, such as quartz, to allow for direct heating of the substrate 108. In some embodiments, it is contemplated that an optional circular shield 139 may be disposed around the substrate support 106 and coupled to a sidewall of the chamber body 101. In some embodiments, the process gas supply source 132 may be adapted to supply multiple types of process gases, for example, a group ID precursor gas and a group V precursor gas. The multiple process gases may be introduced into the chamber through the same process gas inlet 134, or through different process gas inlets 134. Additionally, it is also contemplated that the size, width, and/or number of gas inlets 124, 134, or gas outlets 128, 138 may be adjusted to further facilitate a uniform deposition of material on the substrate 108, including the use of a showerhead. In some embodiments, it is contemplated that the lamphead assemblies 145 are not in contact with the lower dome 104. In some embodiments, the lamphead assemblies 145 may also be positioned above and adjacent to the upper dome 102. In some embodiments, the substrate support 106 may be an annular ring or edge ring having a central opening therethrough, and may be adapted to support the perimeter of the substrate 108.

Exemplary Lamphead Assembly

Figure 2A:
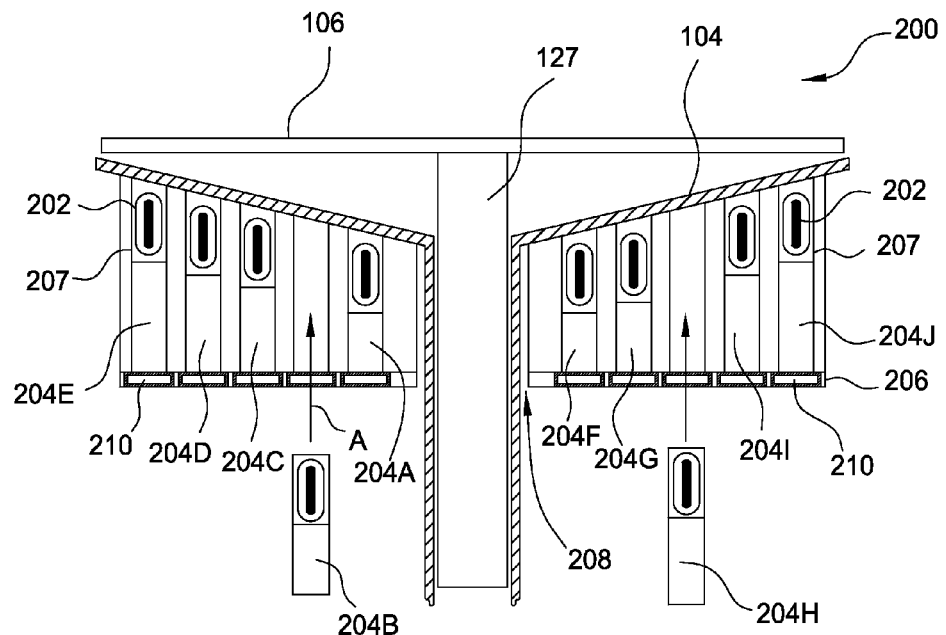
FIG. 2A is a schematic sectional view of a lamphead assembly having a power distribution assembly and lamp adapters with different heights according to one embodiment of the disclosure.

FIG. 2A is a schematic sectional view of a lamphead assembly 200 according to one embodiment of the disclosure. The lamphead assembly 200 may be used in place of the lamphead assembly 145 as shown in FIG. 1. Generally, the lamphead assembly 200 is positioned beneath and in close proximity to the lower dome 104 in an optimal desired manner around the shaft 127 of the substrate support 106, which are partially shown for sake of clarity. The lamphead assembly 200 includes a plurality of lamps 202 disposed within their respective receptacles 207, and a power distribution assembly 206 configured to provide power to the lamps 202. Each of the lamps 202 is attached to its respective lamp adapter 204A-204J coupling to the power distribution assembly 206. The lamp adapters 204A-204J are in electrical communication with the power distribution assembly 206 that is designed to control the power distribution to one or more lamps 202 in a desired approach, as will be discussed below respect to FIG. 5-7. It is noted that the term "lamp adapter" as used in this disclosure may refer to an adapter that optionally contains a fuse to prevent arcing and potential explosion in the lamp during lamp failure. In cases where the lamp adapter does not contain a fuse, the lamp may be a simple capsule style with a fuse contained in the circuit.

In one embodiment, the power distribution assembly 206 may be a single flat circuitry board, such as a printed circuit board (PCB), having multiple concentric circular regions of increasing diameter. The multiple concentric circular regions surround a central opening 208 provided to accommodate the shaft 127 of the substrate support 106. Each circular region substantially corresponds to lamp adapters that are positioned along the same radius of the power distribution assembly 206 and aligned to form a circle. In one embodiment, each of the concentric circular regions is configured to accommodate a plurality of lamps 202, in a substantially radially symmetrical manner (in more or less radius) along the circumference of the power distribution assembly 206. Therefore, the power distribution assembly 206 has multiple rings of lamps 202, and each concentric ring of lamps 202 represents a "zone" of heating. The number of the lamps 202 in each circular region may vary along the radius of the power distribution assembly 206. For example, the number of the lamps 202 may gradually increase along a radial direction from the centre to the peripheral of the power distribution assembly 206 such that the number of the lamps 202 in an outer radius is relatively greater than that in an inner radius of the power distribution assembly 206. In some embodiments, the lamps 202 may have non-symmetric azimuthal arrangement. For example, the lamps 202 may be missing in certain areas or have spacing increased in some regions to allow for substrate transport or cooling channels.

In order to keep a constant distance between the lamps 202 and the lower dome 104, the lamp adapters 204A-204J are configured to have different heights in accordance with the angle of the lower dome 104. For example, the height of the lamp adapters 204A-204J may be gradually increased in a radially outward direction from the shaft 127 of the substrate support 106, or along a radial direction from the centre to the peripheral of the power distribution assembly 206. A constant distance between the lamps and the lower dome ensures a uniform heating profile across the substrate. In one embodiment, the lamps 202 may be approximately 1 mm to about 40 mm from the lower dome 104. With the lamp adapters 204A-204J made at different heights along the radial direction of the power distribution assembly 206, the lamps 202 can maintain the same general size and shape along the lower dome 104.

Alternately, some or all of the distance between the lamps and the lower dome may be allowed to increase with increasing distance from the chamber or dome center with the increased distance being utilized for a reflector, a hollow or solid light pipe, or other optical elements. In such a case, the lamp or lamp adapter may have the same length, or a set of fewer lengths in some cases where at least the outermost zone would be useful if more highly collimated heat radiation can be provided.

Figure 2B:
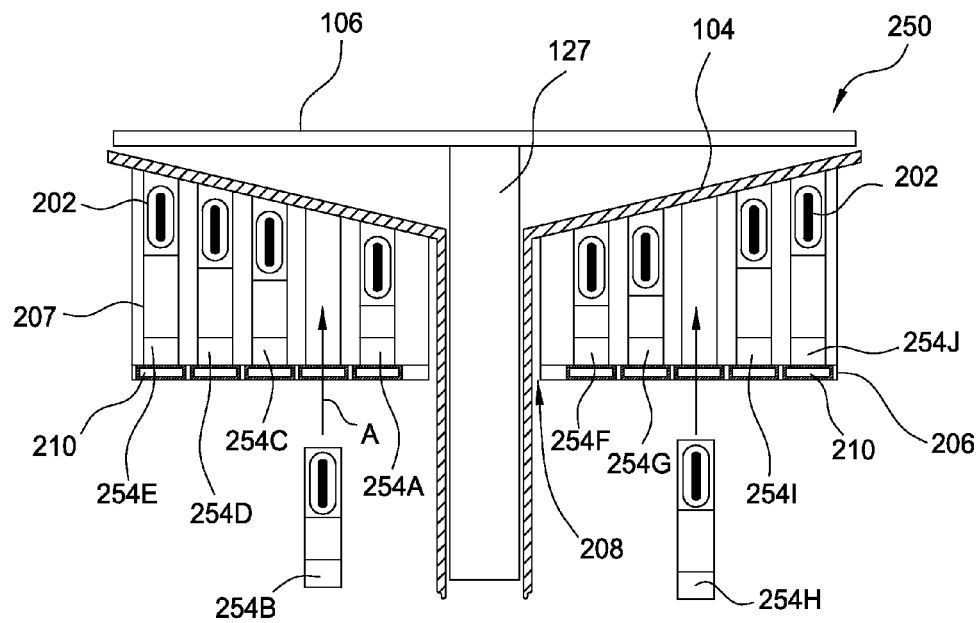
FIG. 2B is a schematic sectional view of a lamphead assembly having a power distribution assembly and lamps with different heights according to another embodiment of the disclosure.

FIG. 2B is a schematic sectional view of a lamphead assembly 250 according to another embodiment of the disclosure. The lamphead assembly 250 shown in FIG. 2B is substantially similar to the lamphead assembly 200 shown in FIG. 2A, except that the lamp adapters 254A-254J are made at a uniform size while the lamps 252 are configured to have different heights in accordance with the angle of the lower dome 104 to provide a constant distance between the lamps 252 and the lower dome 104. The height of each lamp 202 may increase as the radii of the circular regions decrease. That is, the height of the lamps 202 gradually increases in a radially outward direction from the shaft 127 of the substrate support 106. In some alternative embodiments, the lamps 202 may have different heights in accordance with the angle of the lower dome 104 without using the lamp adapters 254A-254J.

In either embodiment shown in FIG. 2A or 2B, the power distribution assembly 206 is provided with a plurality of openings 210 sized to allow the passage of the lamp 202 and the lamp adapters (if used) therethrough. The locations of the openings 210 generally correspond to the lamps 202 in each circular region of the power distribution assembly 206. Therefore, the openings 210 are arranged in a radially symmetrical manner or a more or less radius along the circumference of the power distribution assembly 206. As the openings 210 are located at the bottom of the lamphead assembly 200, 250, an operator can reach each individual lamp 202 from the side of the power distribution assembly 206 (as indicated by arrows "A") for easy, fast replacement of a lamp without moving or dropping the entire lamphead assembly, as opposed to conventional lateral flow chambers with a bottom heating configuration where the entire lamphead assembly must be dropped to retrieve the lamps from the top side of the lamphead assembly.

Figure 3:
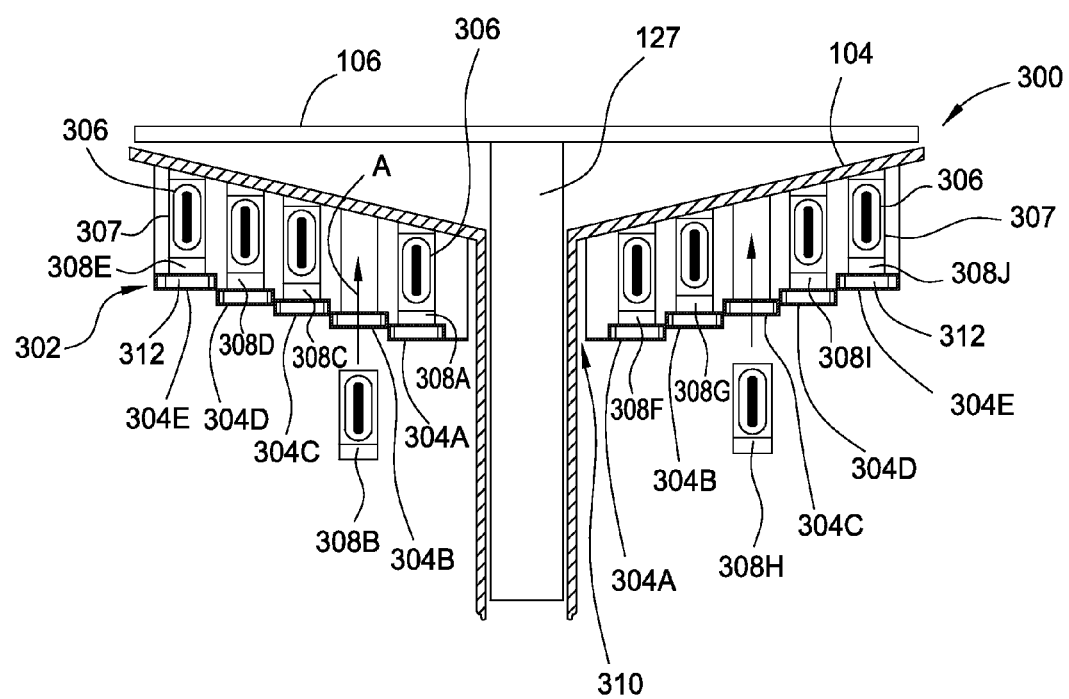
FIG. 3 is a schematic sectional view of a lamphead assembly having multiple ring-type power distribution assemblies configured in a stepped staircase fashion according to yet another embodiment of the disclosure.

FIG. 3 is a schematic sectional view of a lamphead assembly 300 having a power distribution assembly 302 configured in a stepped staircase fashion according to one embodiment of the disclosure. The lamphead assembly 300 may be used in place of the lamphead assembly 145 as shown in FIG. 1. Generally, the lamphead assembly 300 is positioned beneath and in close proximity to the lower dome 104 in an optimal desired manner around the shaft 127 of the substrate support 106, which are partially shown for sake of clarity. The lamphead assembly 300 has a plurality of lamps 306 disposed in their respective receptacles 307. The power distribution assembly 302 is consisted of multiple concentric ring-type circuitry boards 304A-304E configured at different elevations in accordance with the angle of the lower dome 104. For example, the elevation of the multiple concentric ring-type circuitry boards 304A-304E may be gradually increased in a radially outward direction, in line with the angle of the lower dome 104, from the shaft 127 of the substrate support 106. Therefore, the power distribution assembly 302, when viewing from top, has multiple rings of lamps 306, and each concentric ring of lamps 306 represents a "zone" of heating. Since the multiple concentric ring-type circuitry boards 304A-304E are configured to have different heights in accordance with the angle of the lower dome 104, the lamps 306 can be kept at a constant distance from the lower dome 104 to ensure a uniform heating profile across the substrate. With the circuitry boards 304A-304E made at different heights in accordance with the angle of the lower dome 104, the lamps 306 can maintain the same general size and shape along the lower dome 104.

The multiple concentric ring-type circuitry boards 304A-304E may be rigidly coupled to each other by epoxy or other materials having suitable thermal properties to function at temperatures in the lamphead. In some cases, the circuitry board may include stainless steel to enhance rigidity of the structure. Any other suitable approach that is capable of coupling the circuitry boards 304A-304E in a stepped staircase fashion while transmitting power from a power source to the lamps 306 on each circuitry board 304A-304E is also contemplated.

Each of the concentric ring-type circuitry boards 304A-304E generally surrounds a central opening 310 (provided to accommodate the shaft 127 of the substrate support 106) at different radii of the lamphead assembly 300. For example, the circuitry board 304A, the one being closest to the shaft 127, is located immediately next to and surrounded by the circuitry board 304B that is laterally outwardly or further away from the shaft 127. Each circuitry board 304A-304E is configured to accommodate a plurality of lamps 306 along the circumference of the circuitry board. Each circuitry board 304A-304E may be a printed circuit board (PCB) designed to control the power distribution to one or more lamps 306 provided thereon in a desired approach, as will be discussed below respect to FIG. 5-7. The lamps 306 may be optionally attached to their respective lamp adapters 308A-308J, which are in electrical communication with the circuitry board 304A-304E.

Each of the concentric ring-type circuitry boards 304A-304E has a plurality of openings 312 sized to allow the passage of the lamp 306 and the lamp adapters 308A-308J (if used) therethrough. The locations of the openings 312 generally correspond to the lamps 306 in each ring-type circuitry board 304A-304E. Therefore, the openings 312 are located in a radially symmetrical manner or a more or less radius along the circumference of each ring-type circuitry board 304A-304E. As the openings 312 are located at the bottom of the lamphead assembly 300, an operator can reach each individual lamp 306 from the side of the circuitry boards 304A-304E (as indicated by arrows "A") for easy, fast replacement of a lamp without moving or dropping the entire lamphead assembly, as opposed to conventional lateral flow chambers with a bottom heating configuration where the entire lamphead assembly must be dropped to retrieve the lamps from the top side of the lamphead assembly.

It is contemplated that while the power distribution assembly is shown and described above to provide power to the lamps, the power delivery system should not be limited to "board" or planar geometry with holes as discussed herein. Instead, the power delivery system may be in the form of any suitable electrical component structure, such as rail sections with electrical connectors, that is capable of providing power to the lamps arranged in a manner complying with the angle of the lower dome and being able to handle different power requirements by the lamps. Therefore, the electrical traces in the power distribution assembly or electrical component structure can be insulated but free from the constraint of being in the same plane. For example, PCB may be suitable for lower current delivery (less than about 7 amps). For higher power/current and fewer lamps a rail system may be a better configuration for the power delivery. In addition, it is also contemplated that the lamps, the adapters, and/or the power distribution assembly can have a different height/configuration if a top heating approach (i.e., the lamps are disposed above the substrate to heat from top of the processing chamber) is adapted. In such a case, the lamps, the adapters, and/or the power distribution assembly may be configured in a manner similar to those discussed in FIGS. 2A-2B and 3 so that they conform the shape of the upper dome 102.

Figure 4A:
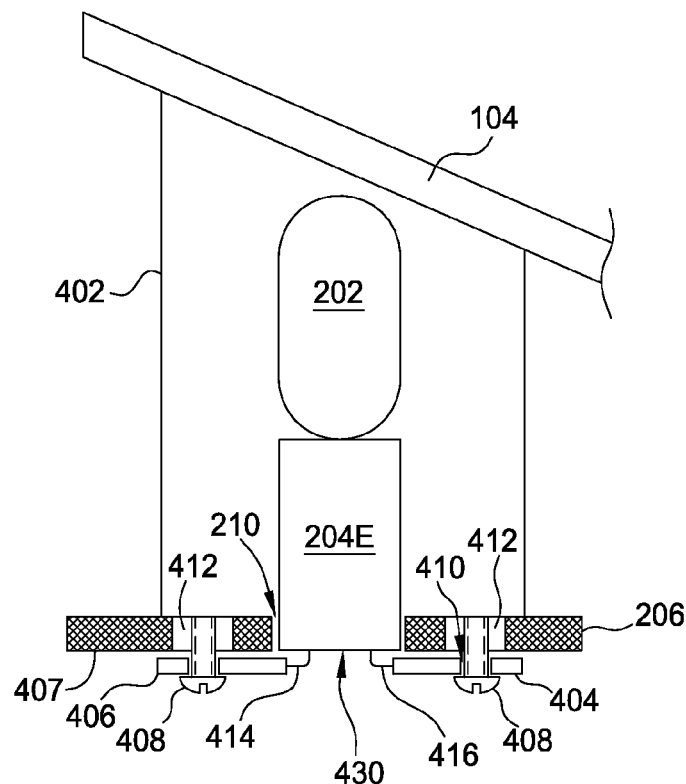
FIG. 4A is a schematic sectional view of a portion of a lamphead assembly having a power distribution assembly with an opening configured to allow the passage of a lamp therethrough according to one embodiment of the disclosure.

FIG. 4A is an enlarged, schematic sectional view of a portion of a lamphead assembly 200 of FIG. 2A according to some embodiments of the disclosure. It is contemplated that the embodiments described herein is also applicable to embodiments discussed with respect to FIGS. 2B and 3. As discussed above, the power distribution assembly 206 has an opening 210 sized to allow the passage of a lamp 202 and optionally a lamp adapter (if used, the lamp adapter attaching to the lamp), for example the lamp adapter 204E, therethrough. The lamp 202 and the lamp adapter 204E are both positioned within a lamphead 402, which is positioned beneath and in close proximity to the lower dome 104.

Figure 4B:
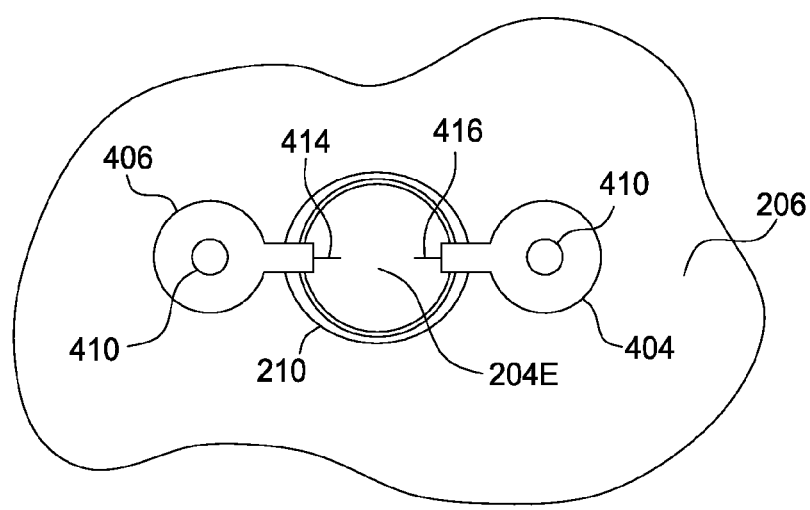
FIG. 4B is a schematic bottom view of the power distribution assembly of FIG. 4A.

In one embodiment where the lamp adapter is used, the lamp adapter 204E is electrically coupled to an electrical contact terminal, which may include a power supply terminal 404 and a ground or return terminal 406, to supply power from a power source to the lamp 222 through the lead wires 414, 416. It should be noted that ground terminal as described herein is typically connected to the power supply ground terminal and may serve as a return path for power current if necessary. Therefore, the ground and return terminal may be used interchangeably throughout the disclosure. The power supply terminal 404 and the ground terminal 406 may be removably attached to the backside 407 of the power distribution assembly 206 through a fastening means. The power supply terminal 404 and the ground terminal 406 may be any type of contact terminal suitable for securing and supplying power to the lamp 202 or the lamp adapter 204E (if used). In one example, the power supply terminal 404 and the ground terminal 406 are an O-ring type terminal (as best seen in FIG. 4B). The O-ring type terminals may have a central opening 410 to allow a screw 408 to secure the power supply terminal 404 and the ground terminal 406 to their corresponding drilled holes 412 in the power distribution assembly 206. FIG. 4B is a schematic bottom view of FIG. 4A showing the power supply terminal 404 and the ground terminal 406 arranged on two opposing sides of the opening 210 according to one example of the disclosure. Each of the power supply terminal 404 and the ground terminal 406 is electrically connected to the lamp 202 (or the lamp adapter if used) through lead wires 414, 416 coupled to the bottom 430 of the lamp adapter 204E.

While a bolt with a rounded top is shown, any other type of fastener may be used to enhance the convenience of the operators. For example, in some embodiments a wing bolt (machine-thread bolt that have a wing-style head) may be used to allow an operator to manually torque the bolts into mating part formed in the power distribution assembly 206 by hand without tools. In some embodiments the fasteners may have a partial ear ring extending outwardly and laterally from the outer surface of the fastener at one end (opposing the rounded head of the screw) so that the fastener can be slipped into the drilled hole 412 and twisted to tighten the partial ear ring of the fastener in a mating notch or cut-out formed in the drilled holes 412. In some embodiments, the O-ring type terminal may have a hanger to prevent the fastener from completely falling out of the central opening 410 of the O-ring type terminal. That is, the hanger retains the fastener axially rotatably, allowing the fastener to be axially displaced without being detached from the O-ring type terminal. In some embodiments, the fastener may be held by the power distribution assembly and the O-ring type terminal on the lamp may be replaced with a C-shaped terminal or connector. A convenient and fast assembly and disassembly of the lamps is therefore achieved as a result of these various embodiments.

Figure 4C:
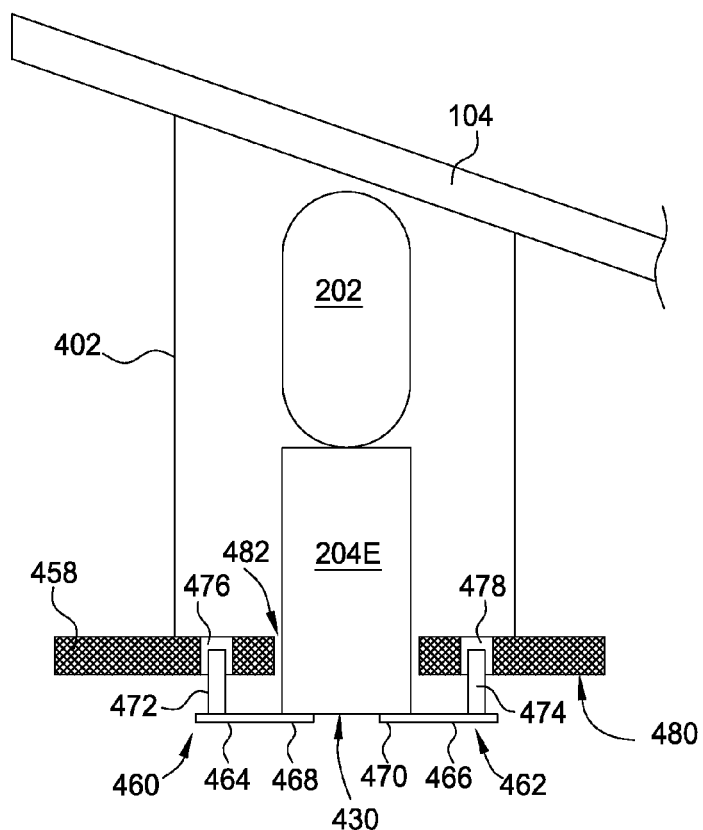
FIG. 4C is an enlarged, schematic sectional view of a portion of a lamphead assembly having a power distribution assembly with an opening configured to allow the passage of a lamp therethrough according to some alternative embodiments of the disclosure.
Figure 4D:
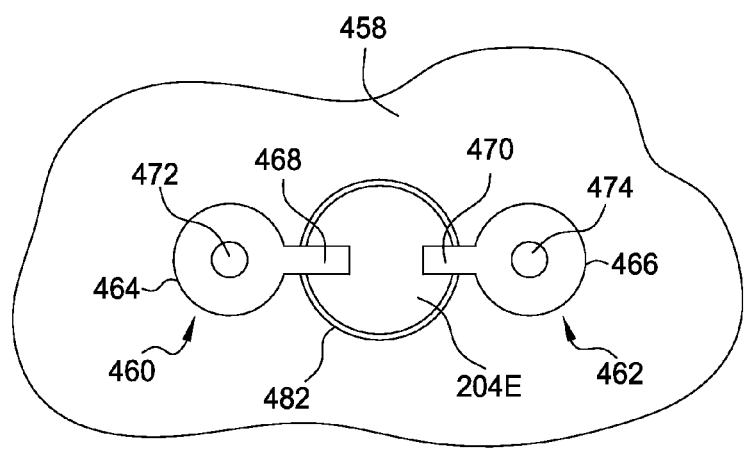
FIG. 4D is a schematic bottom view of the power distribution assembly of FIG. 4C.

To improve certainty of making good electrical connection without relying on operators to tighten fasteners, in some embodiments the lamps or lamp adapters (if used) may be coupled to, and supported by an electrical support configured to engage with a power distribution assembly from the bottom. FIG. 4C depicts an enlarged, schematic sectional view of a portion of a lamphead assembly 200 of FIG. 2A having a power distribution assembly 458 with an opening 482 configured to allow the passage of a lamp therethrough according to some alternative embodiments of the disclosure. FIG. 4D is a schematic bottom view of the power distribution assembly of FIG. 4C. FIG. 4C is similar in structure to FIG. 4A except that the bottom 430 of the lamp adapter 204E (coupling to the lamp 202) is held by two electrical supports 460, 462 at two opposing sides of the bottom 430. The electrical supports 460, 462 serve as electrical contact terminal (La, power supply terminal and ground or return terminal) and each may have a connecting portion 464, 466 and a metal portion 468, 470 coupling to the bottom 430 of the lamp adapter 204E. In one example as shown, the metal portion 468, 470 may have a bar shape extending outwardly from the connecting portion 464, 466 (better seen in FIG. 4D). The connecting portion 464, 466 may have an electrical connector 472, 474 to be inserted into a corresponding socket 476, 478 formed in the power distribution assembly 458. For example, the electrical connector 472, 474 may be constructed as a pin extending upwardly from a top surface of the connecting portion 464, 466 as shown in FIG. 4C, or may be a leaf style connector either single or double ends held, or a knife style connector as commonly seen in US 110-120V plugs, or cylindrical European plugs etc.

In operation, once the faulty lamp has been removed, the lamp adapter 204E with the electrical supports 460, 462 attached thereto along with the replacement lamp is inserted back through an opening 482 of the power distribution assembly 458 from the backside 480 of the power distribution assembly 458. The electrical connectors 472, 474 are inserted into the sockets 476, 478, respectively, upon full insertion of the lamp adapter 204E. Alternatively, the length of the electrical connectors 472, 474 and the lamp adapter 204E may be configured such that the electrical supports 460, 462 hold the lamp adapter 204E in position which requires the electrical connectors 472, 474 to be fully or partially inserted into the sockets 476, 478. The electrical connectors 472, 474 make an electrical contact to the electrical contact terminals formed in the sockets 476, 478 of the power distribution assembly 458, respectively, such as a ground terminal and a power supply terminal (not shown), though which power is supplied to the lamp from a power source. As an additional step to insuring proper seating of all electrical connections, the power distribution assembly may be capped with one or more insurance plates which can only be installed when the connectors are fully seated. For example, the one or more insurance plates can be configured to allow installation on the power distribution assembly only when the electrical connector 472, 474 are fully seated within the corresponding socket 476, 478 formed in the power distribution assembly 458 (or when the contact leads are fully seated within the electrically-conductive receptacle as will be discussed below with respect to FIGS. 5 and 6A-6C). Switches and relays may be coupled to the power distribution assembly so that the lamp circuits may not energize unless the insurance plate is installed.

Figure 5:
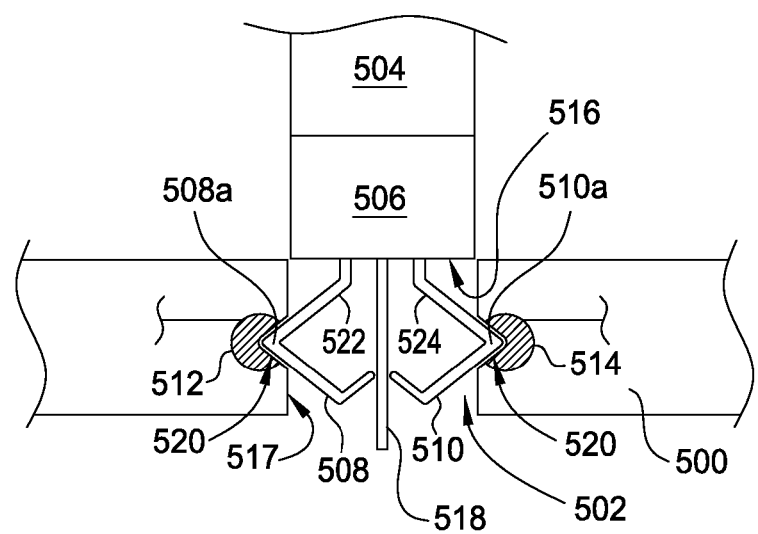
FIGS. 5-7 are schematic sectional views of a portion of a power distribution assembly with connection features according to embodiments of the disclosure.

In some alternative embodiments, the lamps 202 or lamp adapters 204A-204J (if used) may be electrically coupled to the power source without using the O-ring type terminal and fasteners or the plug-in type electrical mechanism as discussed above. Instead, the electrical contact terminals may be provided within the power distribution assembly 206 with a snap-fit or twist-lock engagement to electrically connect the lamps 202 or the lamp adapters 204A-204J to the power source. FIGS. 5-7 are schematic illustrations of a portion of a power distribution assembly having electrical connection features, which may be used in place of the fasteners and the fi-ring type terminal shown in FIG. 4, or applied in the power distribution assembly shown in FIGS. 2A-2B and 3.

FIG. 5 depicts a schematic sectional view of a power distribution assembly 500 having an opening 502 sized to allow the passage of a lamp 504 and a lamp adapter 506 therethrough. The lamp adapter 506 may include electrical contact elements 508, 510 disposed at the bottom 516 of the lamp adapter 506 for making an electrical contact to the electrical contact terminals formed in the power distribution assembly 500, such as a ground terminal 514 and a power supply terminal 512, though which power is supplied to the lamp 504 from a power source. Each of the electrical contact elements 508, 510 may be a metal contact lead extending symmetrically and outwardly from the bottom 516 of the lamp adapter 506. In one embodiment, the electrical contact elements 508, 510 are each bent into a substantially V-shaped spring portion 522, 524 with its apex 508a, 510a pointing away from each other. The radial distance between two apexes 508a, 510a may be larger than the diameter of the lamp 504 and the lamp adapter 506, and slightly larger than the diameter of the opening 502. The opening 502 may have an electrically-conductive V-shaped groove 520 formed in the interior circumferential surface 517 of the opening 502. The V-shaped groove 520 has a symmetrical or asymmetrical cross-section which substantially corresponds to the V-shaped spring portion 522, 524 in order to establish a contact point on the power supply terminal 512 and the ground terminal 514, respectively, through the V-shaped groove 516.

In operation, once the faulty lamp has been removed, the lamp adapter 506 with the lamp 504 attached thereto along with the replacement lamp is inserted back into the opening 502 of the power distribution assembly 500. The V-shaped spring portions 522, 524 are compressed inwardly when initially contacted the interior circumferential surface 517 and then resiled outwardly to their natural state upon full insertion, thereby establishing a snap-fit engagement between the V-shaped spring portion 522, 524 and the V-shaped groove 520. A holding feature 518 may be provided at the bottom 516 of the lamp adapter 506 to enable an easy release of the lamp adapter 506 from the snap-fit engagement by pulling the lamp adapter 506 out of the opening 502 with the holding feature 518. It is contemplated that the V-shaped spring portion or groove is merely an example for illustration purposes. The electrical contact elements and its mating groove may have any other shape or curve to achieve a better contact and engagement.

Figure 6A:
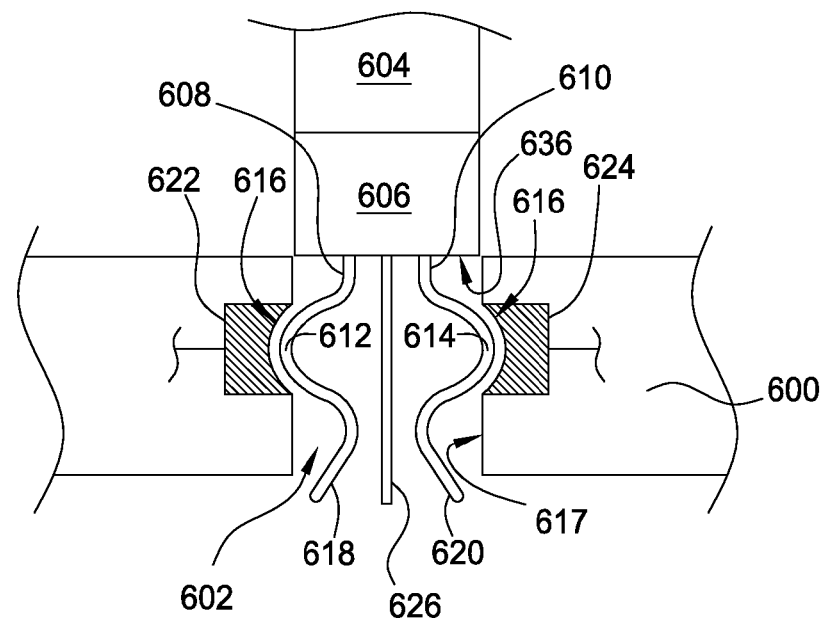
Figure 7:
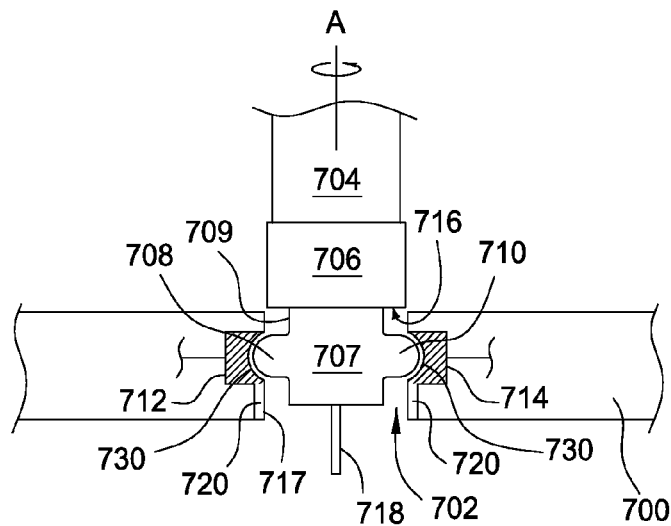

FIG. 6A depicts a schematic sectional view of a power distribution assembly 600 according to another embodiment of the disclosure. FIG. 6A is similar in concept to FIG. 5 except that the electrical contact elements of the lamp adapter 606 are in the general form of ordinary fuse clips. Similarly, the power distribution assembly 600 has an opening 602 sized to allow the passage of a lamp 604 and a lamp adapter 606 therethrough. The lamp adapter 606 has electrical contact elements 608, 610 extending symmetrically and outwardly from the bottom 636 of the lamp adapter 606. The electrical contact elements 608, 610 may be in the form of ordinary fuse clips, i.e., two relatively resilient metal arms each curves outwardly and thence inwardly to form a radius bend 612, 614. The radial distance between the radius bends 612, 614 may be larger than the diameter of the lamp 604 and the lamp adapter 606, and slightly larger than the diameter of the opening 602. The radius bends 612, 614 are configured to make an electrical contact to the electrical contact terminals formed in the power distribution assembly 600, such as a ground terminal 624 and a power supply terminal 622, though which power is supplied to the lamp 504 from a power source. Each distal end 618, 620 of the electrical contact elements 608, 610 may be flared outwardly and extended out of the bottom surface of the power distribution assembly 600. The opening 602 may have an electrically-conductive receptacle 616 formed in the interior circumferential surface 617 of the opening 602. The electrically-conductive receptacle 616 has a symmetrical cross-section which substantially corresponds to the radius bend 612, 614 in order to establish a contact point on the power supply terminal 622 and the ground terminal 624, respectively, through the electrically-conductive receptacle 616.

In operation, once the faulty lamp has been removed, the lamp adapter 606 with the lamp 604 attached thereto along with the replacement lamp is inserted back into the opening 602 of the power distribution assembly 600. The radius bends 612, 614 of the electrical contact elements 608, 610 are compressed inwardly when initially contacted the interior circumferential surface 617 and then resiled outwardly to its natural state within the electrically-conductive receptacle 616 upon full insertion. As a result, a snap-fit engagement between the radius bends 612, 614 and the electrically-conductive receptacle 616 is established. Similarly, the lamp adapter 606 may have a holding feature 626 provided at the bottom 636 thereof to enable an easy release of the lamp adapter 606 from the snap-fit engagement by pulling the lamp adapter 606 out of the opening 602 using the holding feature 626.

Figure 6B:
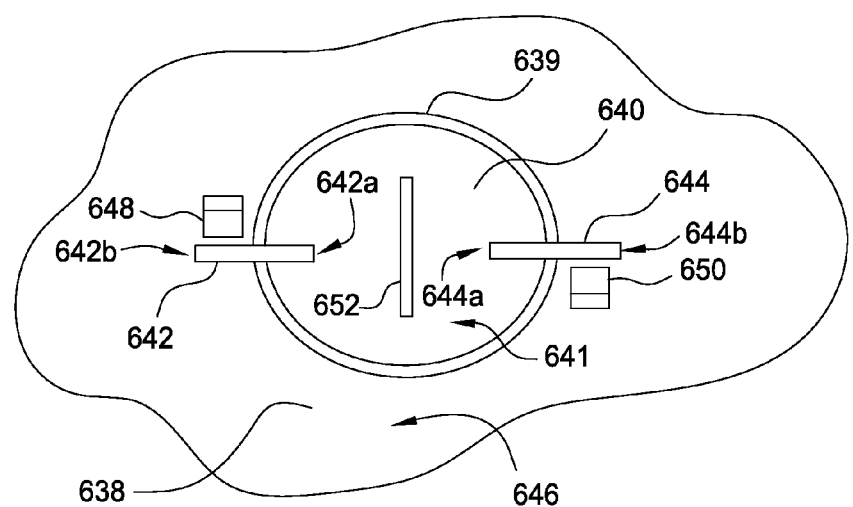

FIG. 6B depicts a schematic bottom view of the power distribution assembly 638 according to an alternative embodiment of the disclosure. Similarly, the power distribution assembly 638 has an opening 639 sized to allow the passage of a lamp (obscured by the lamp adapter 640) and a lamp adapter 640 therethrough. In this embodiment, the lamp adapter 640 is electrically coupled to a power source (not shown) through electrical contact elements 642, 644 disposed at the bottom 641 of the lamp adapter 640. The electrical contact elements 642, 644 may be a lead wire extending symmetrically and outwardly from the bottom 641 of the lamp adapter 640. Each of the electrical contact elements 642, 644 has a first end 642a, 644a attached to the bottom 641 of the lamp adapter 640 and a second end 642b, 644b extending radially outwardly a desired distance that is sufficient to be engaged with electrical contact terminals formed on the back side 646 of the power distribution assembly 638. The electrical contact terminals may include a ground terminal 648 and a power supply terminal 650, which are configured to make an electrical contact to the second end 642b, 644b of the electrical contact elements 642, 644. In one embodiment, the ground terminal 648 and the power supply terminal 650 may be in the general form of ordinary fuse clips, i.e., two relatively resilient metal arms each curves outwardly and thence inwardly to form a radius bend (similar to the radius bend 612, 614 shown in FIG. 6A). The ground terminal 648 and the power supply terminal 650 are configured in a way that the open end of the ground terminal 648 and power supply terminal 650 is pointing along a direction that is in a parallel relationship with the bottom 641. The second end 642b, 644b generally has a symmetrical cross-section which substantially corresponds to the radius bend of the electrical contact terminals in order to establish at least a contact point on the ground terminal 648 and the power supply terminal 650, respectively.

In operation, once the faulty lamp has been removed, the lamp adapter 640 with the lamp attached thereto along with the replacement lamp is inserted back into the opening 639 of the power distribution assembly 638. Upon fully insertion of the lamp into the opening 639, the lamp adapter 640 is rotated clockwise to engage the second end 642b, 644b of the electrical contact elements 642, 644 within the radius bend in a similar manner as described in FIG. 6A. Similarly, the lamp adapter 640 may have a holding feature 652 provided at the bottom 641 thereof to enable an easy release of the lamp adapter 640 from the snap-fit engagement by rotating the lamp adapter 640 counter-clockwise using the holding feature 652.

Figure 6C:
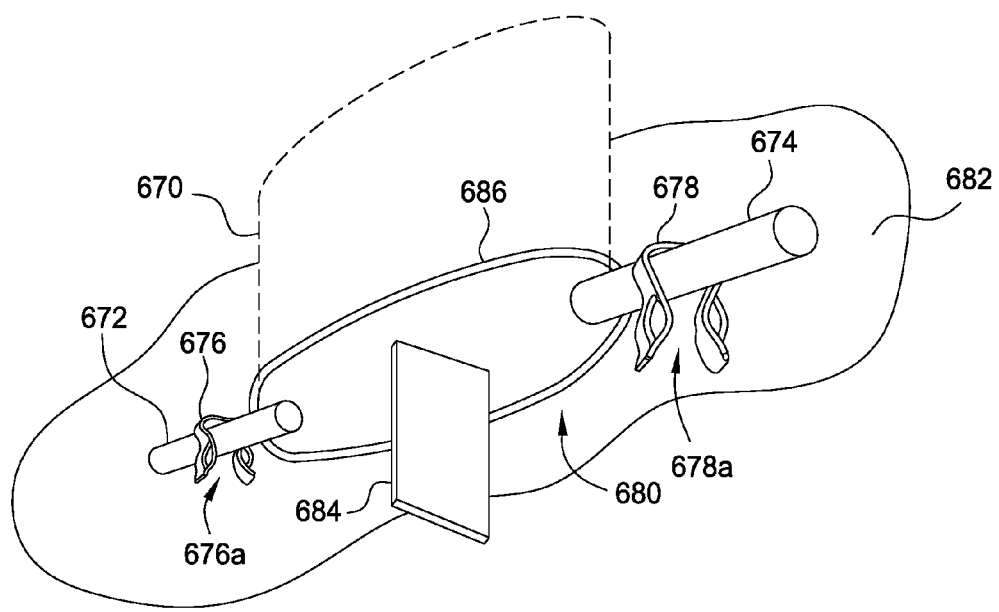

FIG. 6C depicts a prospective view of a bottom 680 of a power distribution assembly 682 according to another alternative embodiment of the disclosure. FIG. 6C is similar in concept to FIG. 6B except that the ground terminal 676 and power supply terminal 678, which may be in the general form of ordinary fuse clips, are configured in a way that the open ends 676a, 678a are facing downwardly from the bottom 680 of the power distribution assembly 682. Therefore, when the lamp is fully inserted into the opening 686 formed in the power distribution assembly 682, the electrical contact elements 672, 674 of the lamp adapter 670 can be engaged within the radius bend of the ground terminal 676 and the power supply terminal 678, respectively, by simply pushing electrical contact elements 672, 674 of the lamp adapter 670 upwardly using a holding feature 684.

FIG. 7 depicts a schematic sectional view of a power distribution assembly 700 according to one another embodiment of the disclosure. FIG. 7 is similar in concept to FIG. 5 except that the electrical contact elements of the lamp adapter 706 are in a twist-locking engagement with the electrical contact terminal provided within the power distribution assembly 700. The power distribution assembly 700 has an opening 702 sized to allow the passage of a lamp 704 and the lamp adapter 706 therethrough. The lamp adapter 706 may have an elongated portion 707 extended outwardly from the bottom 716 thereof. The elongated portion 707 has two projecting nubs 708, 710, serving as the electrical contact elements of the lamp adapter 706, extended radially and outwardly from the outer surface 709 of the elongated portion 707. The power distribution assembly 700 may have "L-shaped" terminal grooves 720 provided on the interior circumference surface 717 of the power distribution assembly 700. The shorter leg of the L-shaped terminal grooves 720 forms an electrically-conductive receptacle 730 configured to receive projecting nubs 708, 710. The electrically-conductive receptacle 730 is in electrical communication with the electrical contact terminals formed in the power distribution assembly 700, such as a power supply terminal 712 and a ground terminal 714, though which power is supplied to the lamp 704 from a power source. While the L-shaped terminal groove is discussed for twist-lock engagement, other shape/type of terminal features, including threads, suitable for making a twist-lock engagement are contemplated.

In operation, once the faulty lamp has been removed, the lamp adapter 706 with the lamp 704 attached thereto along with the replacement lamp is inserted back into the opening 702 of the power distribution assembly 700. The L-shaped terminal grooves 720 allows twist-locking and unlocking operation with the projecting nubs 708, 710 of the elongated portion 707 by about ¼ turn of the lamp adapter 706 (about a long axis "A") upon fully insertion, establishing an electrical connection between the projecting nubs 708, 710 and the electrical contact terminals formed in the power distribution assembly 700. A holding feature 718 similar to the holding feature shown in FIGS. 5 and 6A-6C may be provided at the bottom 722 of the elongated portion 707 to enable an easy release of the lamp adapter 706 from the twist-lock engagement by twisting and pulling the lamp adapter 706 out of the opening 702 using the holding feature 718.

It should be understood that the embodiments discussed in FIGS. 5-7 are illustrative only and can be replaced by any electrical connection/locking features suitable for incorporating to the lamp or lamp adapter (if used), as long as the lamp or lamp adapter can be secured and electrically connected to the electrical contact terminals provided within the power distribution assembly upon fully insertion into the lamphead through the opening of the power distribution assembly. Furthermore, the electrical connection features and lamp (or lamp adapter) holding/positioning features do not have to be the same. Some of the electrical connection features shown in the foregoing could be used for positioning and separate features used for electrical connections.

In addition, the lamp adapter as discussed in this disclosure may be modified to allow an easy, fast replacement of a lamp element by making the lamp element removably engaged with the adapter so that the lamp element and/or the adapter can be individually replaced. The lamp element as described herein generally includes a light transmissive capsule that contains a filament, and a press seal coupling to the light transmissive capsule. When the bulb fails, rather than replacing an entire lamp assembly, only the lamp element of the lamp assembly that contains the faulty bulb is replaced. Therefore, the lamp adapter can be reused. Making the lamp adapter and the lamp element removable from each other and interchangeable in the lamp assembly reduces lamp replacement cost once the adapter is purchased.

The lamp element can be configured to provide sufficient rigidity to handle compressive forces of inserting the lamp assembly into a PCB structure. The lamp adapter may optionally provide a fuse which can be replaced from the side or bottom of the lamp adapter. The lamp adapter may also provide a receptacle for receiving a portion of the lamp element. The receptacle may be contoured and coated to aid in directing thermal radiation to the target in a controlled manner. The lamp adapter may provide thermal conductive features and a cooling path to facilitate heat transfer from the lamp element to the outside world. As a result, the lamp can be operated at a temperature low enough to permit long lamp life.

Figure 8A:
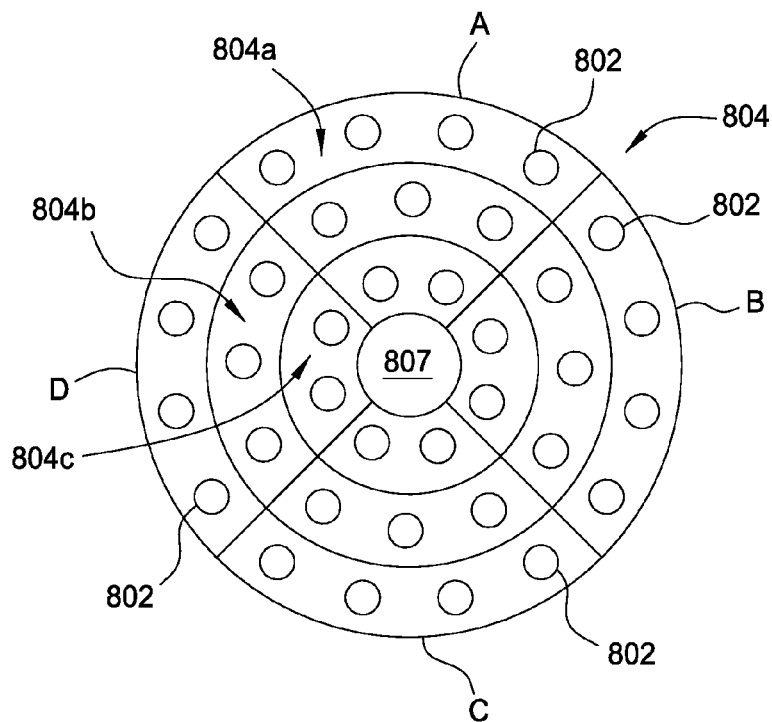
FIG. 8A illustrates a schematic bottom view of a power distribution assembly showing an exemplary arrangement of the lamps and power rails that can be applied to embodiments of FIGS. 2A-3.

FIG. 8A illustrates a schematic bottom view of a power distribution assembly showing an exemplary arrangement of the lamps and power rails that can be applied to embodiments of FIGS. 2A-3, regardless of whether the power distribution assembly is a single flat circuitry board having multiple concentric circular regions, or multiple concentric ring-type circuitry boards configured in a stepped staircase fashion. It should be noted that the openings (for passage of the lamp or lamp adapter) have been omitted in FIGS. 8A-8C for the sake of clarity.

In the embodiment shown in FIG. 8A, the power distribution assembly 804 is a single flat circuitry board having multiple concentric circular regions 804a, 804b, 804c of increasing diameter from a central opening 807 provided to accommodate a shaft of a substrate support. It should be noted that more or less number of concentric circular regions is contemplated. The lamps 802 (represented by circles) in each circular region 804a-804c are spaced apart at a regular interval along the circumference of the power distribution assembly. The lamps 802 may be grouped into multiple zones, which may be located in a radially symmetrical manner. In one example as shown, the lamps 802 are grouped into four quadrants (quadrants A-D), with quadrant A being opposite to quadrant C and quadrant B being opposite to quadrant D. Each quadrant A-D may be individually controlled to allow controlled radiative heating of different areas of the substrate or the process chamber for different process needs. For example, a power signal provided to the lamps in quadrant B (located in the gas injection side in a cross-flow process chamber) may be higher than a power signal provided to the lamps in quadrants A, C and D to enhance activation of gas precursor on the gas injection side.

Figure 8B:
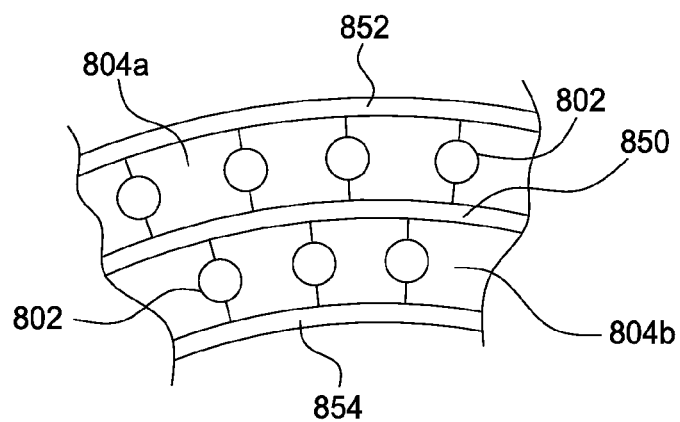
FIGS. 8B and 8C are a schematic bottom view of a portion of a power distribution assembly illustrating various approaches of powering lamps.

In some embodiments as shown in FIG. 8B, the lamps 802 may be arranged in series in the circular regions 804a, 804b and share a common ground rail 850, and each of lamps 802 in the circular region 804a and 804b, for example, may be powered by the first power rail 852 and the second power rail 854, respectively. That is, each of electrical contact elements of an individual lamp 802 may be electrically connected to respective power supply terminal and ground terminal (in a manner as discussed above with respect to FIGS. 4A-7), which are in electrical communication with the first power rail 852 and the common ground rail 850 and second power rail 854 and the common ground rail 850, respectively. In some cases, the lamps 802 in the circular regions 804a, 804b may be azimuthally biased (individually zone-controlled) to compensate for any chamber asymmetries in heat loss due to non-uniform electrical characteristics caused by the slit valve location or gas entry/exit etc., or compensate for pumping asymmetries caused by the location of the pump. In such a case, separate zoned power rail(s) may be used to separately power lamps located in different quadrants along the same/different circular regions.

In some embodiments, one or more sets of common power rails and ground rails may be used to power the lamps 802 arranged in series in different quadrants of the same circular region 804a-804c. In one example shown in FIG. 8C, the lamp 802a in circular region 804c in quadrant A may be connected to the lamp 802h (positioned opposing to the lamp 802a) in the circular region 804c in quadrant C in series via a connector 841 and a connecting wire 840, the lamp 802b in the circular region 804c in quadrant A may be connected to the lamp 802g (positioned opposing to the lamp 802b) in the circular region 804c in quadrant C in series via a connector 843 and a connecting wire 842, the lamp 802c in circular region 804c in quadrant A may be connected to the lamp 802f (positioned opposing to the lamp 802c) in the circular region 804c in quadrant C via a connector 845 and a connecting wire 844, and the lamp 802d in circular region 804c in quadrant A may be connected to the lamp 802e (positioned opposing to the lamp 802d) in the circular region 804c in quadrant C via a connector 847 and a connecting wire 846. In some embodiments, each of the lamps 802a-802d in the circular region 804c in quadrant A and each of the lamps 802e-802h in the circular region 804c in quadrant C may be connected to the common ground rail 882 and powered by the common power rail 880. That is, each of electrical contact elements of an individual lamp may be electrically connected to respective power supply terminal and ground terminal (in a manner as discussed above with respect to FIGS. 4A-7), which are in electrical communication with the common power rail 880 and common ground rail 882, respectively. The common ground rail and the common power rail may be positioned in the different quadrants A and C as shown, or may be positioned in the same quadrant or two adjacent quadrants. In some cases, the lamps 802a-802h in the circular region 804c may be azimuthally biased (individually zone-controlled) to compensate for chamber asymmetries in heat loss due to non-uniform electrical characteristics caused by the slit valve location or gas entry/exit etc., or compensate for pumping asymmetries caused by the location of the pump. In such a case, one or more separate zoned power rails may be used to separately power lamps located in different quadrants along the same/different circular regions. It is contemplated that the lamps may or may not require azimuthal biasing, depending upon the chamber design and/or the process scheme.

While the common power rail 880 is disposed opposite to the common ground rail 882, the common power and ground rails may be positioned in the same quadrant or in any two adjacent quadrants. Alternatively, each quadrant or zone may be provided with its own power rail and ground rail so that all the lamps in each zone or quadrant are powered by a common power rail and ground rail.

Figure 8C:
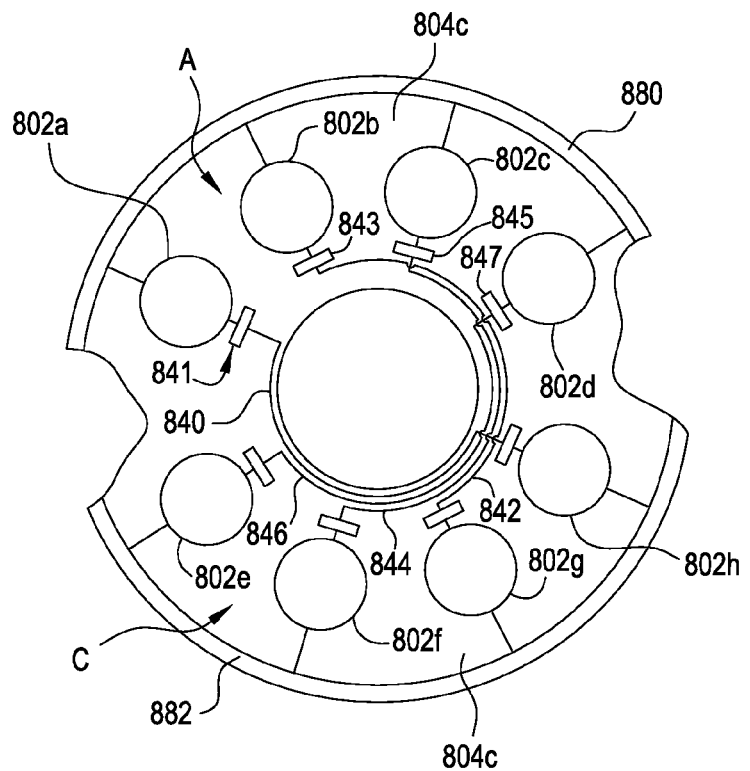

The concept of embodiments discussed in FIG. 8A-8C are equally applicable to lamps dividing into 2 zones, 3 zones, 6 zones, 8 zones, 12 zones, or more in a radially symmetrical manner. In any cases, it is contemplated that the power signal provided to one or more lamps in each zone or quadrant can be independently controlled to allow for azimuthal temperature control across a substrate, or to compensate for a symmetry in the process chamber in the case of a lamp failure in a particular zone by increasing the power to other lamps in that zone or adjacent zones.

Exemplary Lamp Failure Detection System

The above description discloses an approach for fast replacement of a lamp without moving the entire lamphead assembly by providing an opening in a power distribution assembly for the lamphead assembly. To further reduce the chamber downtime, it would be useful to have an improved lamp failure detection system that can quickly identify which lamp has failed, and identify the type of failure, as discussed above in the background. Below are described several embodiments of a lamp failure detection system and a corresponding method that can be incorporated with various lamphead assemblies as discussed above with respect to FIGS. 2A-8C. The inventive method uses voltage measurements, and has the advantage of allowing identification of which lamp has failed, and the type of failure. A system utilizing this method is simpler, more reliable, and more accurate than the prior art detection system. Details of the lamp failure detection system are discussed below.

Figure 9A:
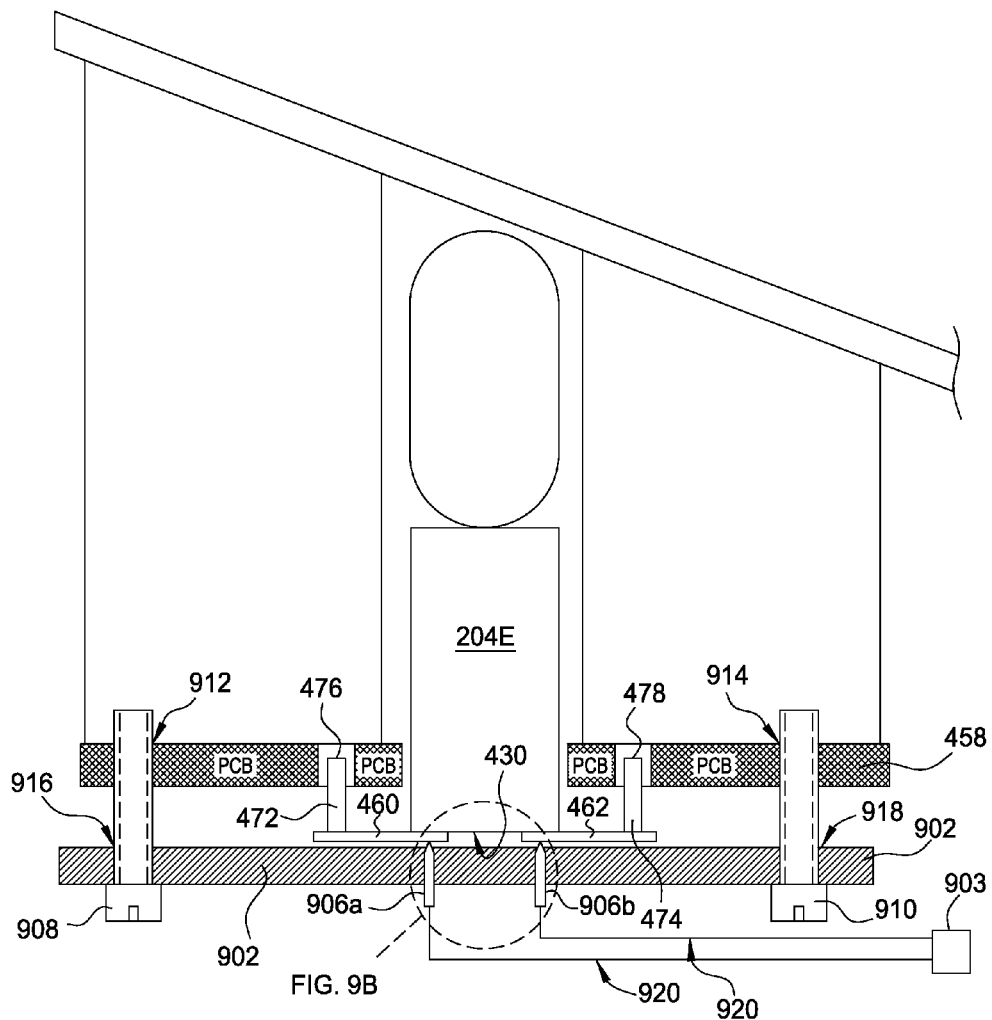
FIG. 9A depicts an enlarged, schematic sectional view of a portion of a lamphead assembly of FIG. 2A having a supporting board coupled to a power distribution assembly according to embodiments of the disclosure.
Figure 9B:
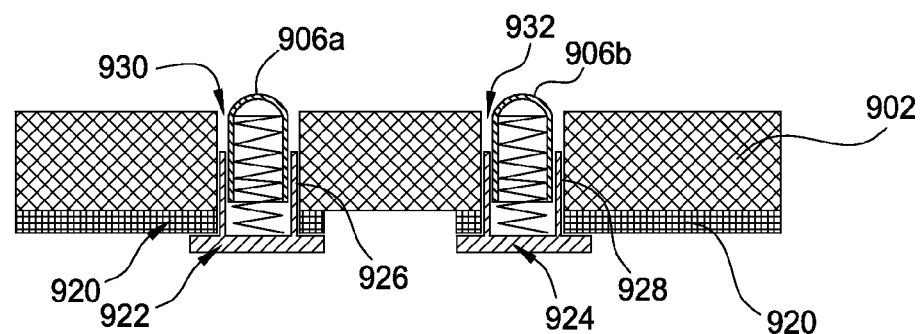
FIG. 9B is an enlarged, schematic sectional view of the supporting board of FIG. 9A showing an exemplary electrical contact elements passing through the supporting board for lamp failure detection.

FIG. 9A depicts an enlarged, schematic sectional view of a portion of a lamphead assembly 200 of FIG. 2A having a supporting board 902 coupled to a power distribution assembly according to embodiments of the disclosure. The supporting board 902 has a lamp failure detection system 903 connected to the power distribution assembly 458 via electrical contact elements 906a, 906b. The lamp failure detection system 903 is configured to identify a failed lamp among a plurality of lamps and provide identification of the failure type. FIG. 9B is an enlarged, schematic sectional view of the supporting board 902 of FIG. 9A showing an exemplary electrical contact elements 906a, 906b passing through the supporting board 902 for lamp failure detection. For ease of illustration, the discussion of FIG. 9A will be based on FIG. 4C except that the supporting board 902 and the lamp failure detection system 903 are further included. It should be noted that the supporting board 902 and the lamp failure detection system 903 described herein can be coupled to various embodiments of the power distribution assembly as discussed above with respect to FIGS. 2A, 2B and 3, where the power distribution assembly is constructed as a single flat circuitry board coupling to lamp adapters of different heights (FIG. 2A) or lamps with different heights (FIG. 2B), or is constructed as multiple concentric ring-type circuitry boards in a stepped staircase fashion (FIG. 3) in accordance with the angle of a lower dome of the process chamber to provide a constant distance between the lamps and the lower dome.

In one embodiment, the supporting board 902 may be coupled to the power distribution assembly 458 through two or more fasteners (two fasteners 908, 910 are shown). The fasteners 908, 910 may be any suitable connecting approach such as a bolt for engagement with the power distribution assembly 458. The fasteners 908, 910 can be respectively inserted into corresponding sockets 912, 914 formed in the power distribution assembly 458. Specifically, the supporting board 902 is configured so that the fasteners 908, 910 aligned with the sockets 912, 914 are inserted through respective mounting holes 916, 918 in the supporting board 902. As a result, the lamp adapter 204E is supported and secured by the supporting board 902. Installation of the supporting board 902 and associated circuitry also guarantees (for a chosen set of electrical connectors) that the installed lamps are all properly completely connected.

Upon fully insertion of the fasteners 908, 910 into the sockets 912, 914, the end or tip of the electrical contact elements 906a, 906b is in physical contact with the metal portions 468, 470 coupling to the bottom 430 of the lamp adapter 204E to allow voltage measurement of the lamp at contacting areas. The values of lamp voltage measurements are then sent to a data acquisition device (not shown) located in the lamp failure detection system 903 through electrical conductive traces 920. As will be discussed in more detail below, the data acquisition device is configured to sample voltage signals along a circuit path formed by at least two serially connected lamps. The data acquisition device may include any suitable circuitry to convert the analog voltage inputs to digital values, which are sent to a controller (not shown) in the lamp failure detection system 903 where the voltage drops across each lamp are measured to determine if a lamp is in a failure state, and the type of failure state. It should be understood that while the voltage measurements as discussed herein are performed in association with the metal portions 468, 470 coupling to the bottom 430 of the lamp adapter 204E, the voltage measurements may be taken at any suitable locations of the electrical supports 460, 462, or any other electrically conductive components in electrical communication with the lamp (with or without lamp adapter) as discussed in various embodiments of the disclosure so long as the voltage measurement of the lamp can be performed, either directly or indirectly. It is contemplated that the voltage measurements may also be taken at any electrical components associated with a lamp or lamp adapter coupling to a lamp, such as lamp pins or power leads.

The supporting board 902 may be made of any suitable material that posses the requisite mechanical strength, electrical properties, and desirably low thermal conductivity. Such materials may include, but are not limited to epoxy-based materials or resin-based materials. Other suitably rigid, electrically isolating, and thermally insulating materials that have a thermal conductivity of less than about 0.8 W/(K-m) may also be used and still fall within the scope of the disclosure. In alternative embodiments, the supporting board 902 may be a printed circuit board (PCB) including the circuitry of the lamp failure detection system 903 as one piece structure. Details of the lamp failure detection system 903 are further discussed below with respect to FIGS. 10-18.

In one embodiment, the electrical contact elements 906a, 906b may be a spring-loaded pin as shown in FIG. 9B. The supporting board 902 may have passageways 930, 932 sized to allow the electrical contact elements 906a, 906b to pass through. The electrical contact elements 906a, 906b may be disposed on respective electrically conductive pads 922, 924, which are in electrical communication with the data acquisition device within the lamp failure detection system 903 via the electrical conductive trace 920. Each of the electrical contact elements 906a, 906b may be axially confined within a tube 926, 928 mounted on the electrically conductive pads 922, 924. The tubes 926, 928 facilitate alignment of the electrical contact elements 906a, 906b with the metal portions 468, 470, respectively. As discussed above in FIG. 4C, the metal portions 468, 470 hold the lamp adapter 204E in position to allow insertion of the electrical connectors 472, 474 into the sockets 476, 478. The electrical connectors 472, 474 make an electrical contact to the electrical contact terminals formed in the sockets 476, 478 of the power distribution assembly 458, respectively, such as a ground terminal and a power supply terminal (not shown), though which power is supplied to the lamp from a power source. The electrical contact elements 906a, 906b measure the voltage of the metal portions 468, 470 using the method discussed below with respect to FIGS. 10-18 to identify if the lamp has failed, and the type of failure.

Figure 9C:
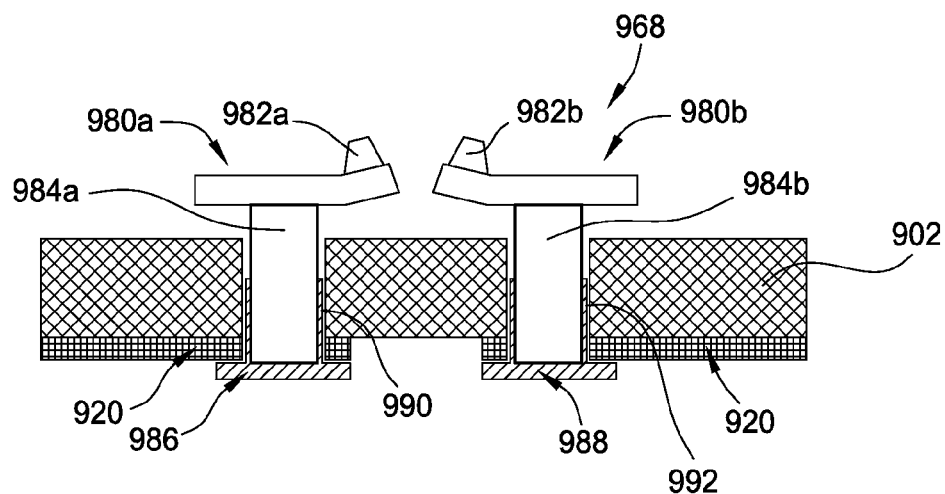
FIG. 9C shows an exemplary electrical contact element according to another embodiment of the disclosure.

Alternatively, the electrical contact elements 906a, 906b may be any other suitable contact means that is capable of establishing a gentle electrical contact with the metal portions 468, 470 of the lamp adapter 204E. For example, FIG. 9C shows an exemplary electrical contact element 968 according to another embodiment of the disclosure. FIG. 9C is substantially identical to FIG. 9B except that the electrical contact elements 906a, 906b are being replaced with the electrical contact element 968 for voltage measurement. The electrical contact element 968 generally includes cantilever arms 980a, 980b each having a microprobe 982a, 982b formed at distal end of the cantilever arm 980a, 980b. The ends at which the microprobe 982a, 982b are located may curve upwardly away from the supporting board 902. In some cases, the cantilever arms 980a, 980b can be recessed to allow a flat support region. The microprobe 982a, 982b may have a cone-shape with a tip at the top and a large base at the bottom. The tip is used to contact and measure voltage of the metal portions 468, 470 using the method to be discussed below with respect to FIGS. 10-18 to identify if the lamp has failed, and the type of failure.

The cantilever arms 980a, 980b may be formed of Cu, Al, AlCu alloys, or any other suitable material. The microprobe 982a, 982b may be formed of Cr or Ni, or formed from the same material as the cantilever arms 980a, 980b. Each of the cantilever arms 980a, 980b is coupled to respective electrically conductive poles 984a, 984b mounted on electrically conductive pads 986, 988, which are in electrical communication with the data acquisition device within the lamp failure detection system 903 via the electrical conductive trace 920. Similarly, each of the electrically conductive poles 984a, 984b may be axially confined within a tube 990, 992 mounted on the electrically conductive pads 986, 988. The tubes 990, 992 secure the electrically conductive poles 984a, 984b and facilitate alignment of the microprobe 982a, 982b with the metal portions 468, 470, respectively. Note that the tubes 990, 992 are optional and may not required. Other types of electrical contact elements are contemplated as long as they can properly contact lamp pins or power leads for voltage measurement purpose.

Various embodiments of lamp failure detection system 903 are now discussed in greater detail. As discussed above, a lamphead may contain several hundred tungsten halogen lamps which are divided into multiple, radially symmetric zones, and each zone is separately powered by a driver so that the lamp power can be adjusted for each zone. Within each zone are multiple lamps, and the lamps are typically divided into pairs with each lamp pair connected to the driver. The two lamps of each pair may be connected in series as discussed above in FIGS. 8A-8C.

Figure 10:
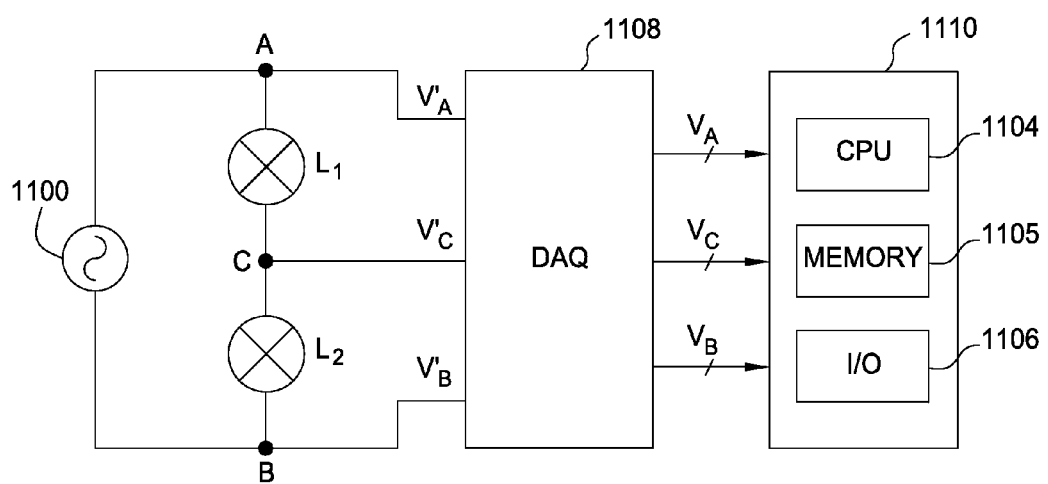
FIG. 10 shows a lamp failure detection system in electrical communication with one lamp pair.

FIG. 10 shows a lamp failure detection system in electrical communication with one lamp pair. Although only one lamp pair is shown, multiple lamp pairs may be connected in parallel with the same power supply, and the same failure detection system and method may be used for each lamp pair so long as the circuitry used will allow measurement of the voltage drop across each lamp in each lamp pair. Referring back to FIG. 10, two lamps L1 and L2 are connected in series with a power supply 1100. In this example, the power supply is AC, but could also be a DC supply. In the present example, the source is AC and may include any suitable circuitry, such as a silicon controlled rectifier (SCR) driver.

A data acquisition device (DAQ) 1108 is used to take voltage measurements at points A, B, and C. As mentioned earlier, the voltage measurements may be taken at any suitable locations of the electrical supports 460, 462, or any other electrically conductive components in electrical communication with the lamp (with or without lamp adapter) as discussed in various embodiments of the disclosure so long as the voltage measurement of the lamp can be performed, either directly or indirectly. The data acquisition device 1108 may include any suitable circuitry such as a multiplexer (MUX) and analog-to-digital converter (ADC). The ADC converts the analog voltage inputs $V'_A$, $V'_B$, and $V'_C$ to digital values $V_A$, $V_B$, and $V_C$ which are sent to a controller 1110 where the voltage drops across each lamp are determined. In this example, the voltage drop across lamp L1 is $V_A - V_C = V_{L1}$, and the voltage drop across lamp L2 is $V_C - V_B = V_{L2}$. The controller 1110 applies the voltage drop values $V_{L1}$ and $V_{L2}$ to a set of conditionals to determine if either lamp is in a failure state. This process may be repeated for each lamp pair in a zone, and for each zone of the lamp array.

The controller 1110 may include any suitable components, such as a central processing unit (CPU) 1104, memory 1105, and support circuits (I/O) 1106. The CPU 1104 may be any form of computer processor that can control and/or monitor lamp operation. The memory 1105 may be of any type such that software instructions and data can be coded and stored within the memory 1105 for execution by the CPU 1104. The support circuits 1106 may include, for example, power supplies, input/output circuitry, analog-to-digital converters, and the like.

FIGS. 11A-11F show how the voltage drops across each lamp are used to determine if a lamp is in a failure state, and the type of failure state. $V_1$ and $V_2$ represent the measured digital voltage drop values for lamps L1 and L2, respectively. In each circuit represented by FIGS. 11A-11F, an AC voltage V' is applied to the lamp pair, and the corresponding digital voltage is V. Phases øA and øB indicate that the power source is three phase AC, and the lamp pair is connected across the line-to-line voltage of these two phases.

In the lamp failure detection method described in FIGS. 11A-11F, a lamp is assumed to be in one of three states: an open state; a closed or normal state; or a partially shorted state. An open state indicates that the internal lamp circuit is open and no current can flow through the lamp. In the case of an incandescent lamp, a broken filament would cause an open lamp state. A closed state means that the internal lamp circuit is closed and current can flow through the lamp as in the case of normal lamp operation. For a lamp that is partially shorted, the lamp resistance is below its normal value, and this will cause a decrease in the voltage drop across lamp, but the voltage drop will remain nonzero. A completely shorted lamp would represent the limiting case where the lamp resistance went to zero, and the voltage drop across the lamp would also go to zero. However, the state of a completely shorted lamp is not included in the present embodiment of this method for two reasons. Firstly, the most common lamp failure modes are the open or partially shorted states, and a completely shorted lamp is unlikely. Typically, a shorted lamp has sufficient resistance to produce a nonzero and measurable voltage drop. Secondly, if a lamp were to be completely shorted, the overall decrease in resistance for the two lamps in series would typically result in a current magnitude that would overload the remaining good lamp and cause it to go into an open state. Therefore, for the present embodiment, a zero voltage drop across a lamp implies that no current is flowing through the lamp, and not that the lamp is completely shorted.

Figure 11A:
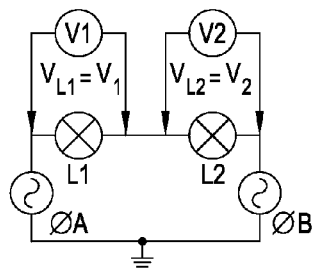
FIGS. 11A-11F are schematic views depicting lamp operation.

FIG. 11A shows the state where both lamps L1 and L2 are in a normal operating state. The voltage across L1 has a nonzero value $V_1$, and the voltage across L2 has a nonzero value $V_2$. The condition of normal operation for both lamps can be expressed as follows: If $V_{L1} \neq 0$ and $V_{L2} \neq 0$ and $|V_{L1}-V_{L2}| \leq \alpha$, then L1 and L2 are normal. Here, $\alpha$ represents a differential voltage threshold value which is used to define a state of normal lamp operation. This threshold value is typically selected based on experience with types of lamps used and variations allowable. In the case of rapid thermal processing (RTP), the allowable threshold may be less than 5 percent of the average voltage across each lamp. Alternatively, if $V_{L1} \neq 0$ and $V_{L2} \neq 0$ and $|V_{L1}-V_{L2}| > \alpha$, then L1 and L2 are not in a normal operating state, and a failure state can be defined for the lamp pair.

Figure 11B:
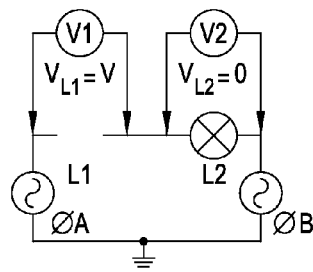

In FIG. 11B, lamp L1 is in an open state and lamp L2 is in a closed and normal state. This situation will produce the voltage measurements shown. The voltage across L2 will be zero since there is no longer a complete circuit to allow current flow through the lamps. But since L2 is not open, the voltage measured across L1 will now have the value V which is the voltage normally applied to the lamp pair. This condition can be expressed as: If $V_{L1} \neq 0$ and $V_{L2} = 0$, then L1 is open and L2 is closed. A failure state for lamp L1 exists, and a signal can be sent to a display screen to identify which lamp of the L1 and L2 pair has failed. Note that $V_{L1}=V$ could have been used in place of $V_{L1} \neq 0$ in the if-then statement above, but $V_{L1} \neq 0$ simplifies the statement without changing the conclusion that L1 is open. Additionally, the if-then statement can be further shortened to: If $V_{L2}=0$, then L1 is open. This statement does not indicate the status of L2, but is always true when L1 is open.

Figure 11C:
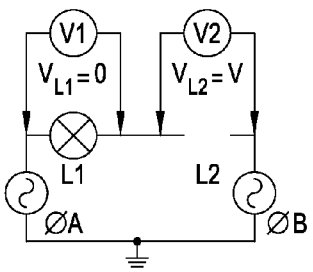

FIG. 11C shows the case where lamp L2 is in an open state and lamp L1 is in a closed state, which is similar to the situation described above. This condition can be expressed as: If $V_{L1}=0$ and $V_{L2} \neq 0$, then L2 is open and L1 is closed. Additionally, the if-then statement can be further shortened to: If $V_{L1} \neq 0$, then L2 is open.

Figure 11D:
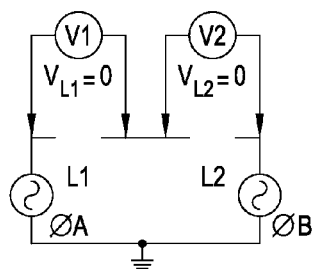

In FIG. 11D, both lamps L1 and L2 are in an open state. For some embodiments, such as shown in FIG. 11D, the lamp failure detection system may be designed in the event of open circuits to provide zero voltage readings. In this case, the voltages shown across each lamp L1 and L2 are zero when both lamps are open. The condition for both lamps in an open state can be expressed as: If $V_{L1}=0$ and $V_{L2}=0$, then L1 and L2 are open. In other embodiments, the lamp failure detection system may be designed to indicate that an open circuit has been detected when both lamps are open, and not provide zero voltage readings.

Figure 11E:
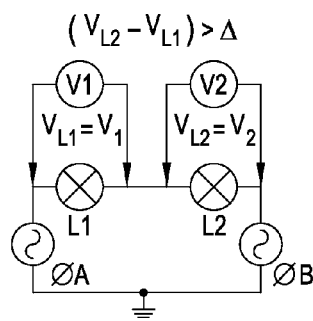

Another failure state is possible for the lamp pair. In FIG. 11E, lamp L1 has a partial internal short, and lamp L2 is normal. In this case, neither lamp L1 nor L2 are in an open state and each lamp will have a nonzero voltage drop. It can be appreciated that a partial short in lamp L1 will reduce the lamp resistance below its normal value, and this will cause a decrease in the voltage drop across lamp L1. This observation suggests that a partial internal short in one lamp will increase the difference between voltage drops for each lamp beyond the value one would expect for normal lamp operation. This state can be represented by a conditional where the difference in voltages $V_{L2}$ and $V_{L1}$ is compared to a differential voltage threshold value. If this difference exceeds the threshold value, then an unacceptable partial short condition is identified for lamp L1 and a failure state exists. This conditional can be expressed as: If $V_{L1} \neq 0$ and $V_{L2} \neq 0$ and $(V_{L2}-V_{L1}) > \Delta$, then lamp L1 has a partial short. The choice of differential voltage threshold value $\Delta$ will depend on the allowable variation in lamp intensities, but may be less than 8 percent of the average voltage across each lamp for application to RTP. Additionally, the if-then statement can be further shortened to: If $(V_{L2}-V_{L1}) > \Delta$, then lamp L1 has a partial short. If either $V_{L1}=0$ or $V_{L2}=0$, then a lamp is open and a failure state will be detected.

Figure 11F:
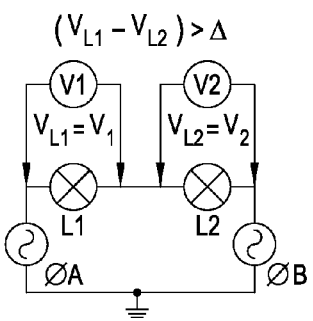

FIG. 11F shows the case where lamp L2 has a partial short and lamp L1 is normal. Similar reasoning applies here as for the previous failure state. The conditional can be expressed as: If $V_{L1} \neq 0$ and $V_{L2} \neq 0$ and $(V_{L1}-V_{L2}) > \Delta$, then lamp L2 has a partial short. The same threshold value $\Delta$ used in the case above could apply here, and the if-then statement can be further shortened to: If $(V_{L1}-V_{L2}) > \Delta$, then lamp L2 has a partial short.

Figure 12:
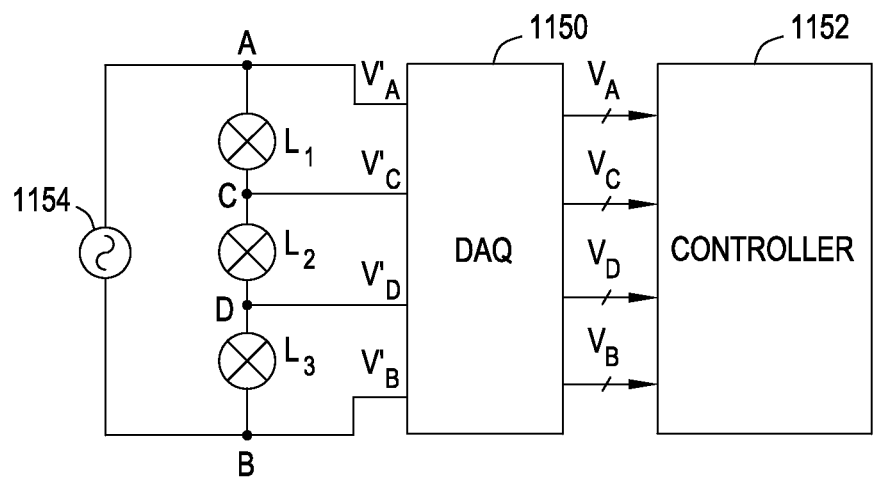
FIG. 12 is a block diagram of another embodiment of a lamp failure detector.

FIG. 12 is another embodiment for a lamp failure detection system when there are three lamps in series. It is to be appreciated however, that the present embodiment may be used with more than three lamps, as long as there is sufficient voltage supply to operate the lamps of the system. The lamphead contains several hundred tungsten halogen lamps which are divided into multiple, radially symmetric zones, and each zone is separately powered by an SCR driver so that the lamp power can be adjusted for each zone. Within each zone are multiple lamps, and the lamps are divided into groups of (in this example) three lamps with each lamp group connected to the SCR driver. The three lamps of each group are connected in series.

FIG. 12 shows one lamp group in electrical communication with a lamp failure detection system. The lamps L1, L2, and L3 are connected in series with a power supply 1154. As before, the power supply is AC, but could also be a DC supply. In this example, the source is AC and represents a silicon controlled rectifier (SCR) driver. A data acquisition device (DAQ) 1150 is connected to the circuit as shown to take voltage measurements at points A, B, C, and D. As mentioned earner, the voltage measurements may be taken at any suitable locations of the electrical supports 460, 462, or any other electrically conductive components in electrical communication with the lamp (with or without lamp adapter) as discussed in various embodiments of the disclosure so long as the voltage measurement of the lamp can be performed, either directly or indirectly. The ADC converts the analog voltage inputs $V'_A$, $V'_B$, $V'_C$, and $V'_D$ to digital values $V_A$, $V_B$, $V_C$, and $V_D$ for all lamps in the series. These values are sent to a controller 1152 where the voltage drops across each lamp are determined. In this example, the voltage drop across lamp L1 is $V_A-V_C=V_{L1}$, the voltage drop across lamp L2 is $V_C-V_D=V_{L2}$, and the voltage drop across the lamp L3 is $V_D-V_B=V_{L3}$.

The controller 1152 applies the voltage drop values $V_{L1}$, $V_{L2}$, and $V_{L3}$ to a set of conditionals to determine if a lamp is in a failure state. This process is repeated for each lamp group in a zone, and for each zone of the lamp array.

FIGS. 13A-13E show how the voltage drops across each lamp are used to determine if a lamp is in a failure state, and the type of failure state. $V_1$, $V_2$ and $V_3$ represent the measured digital voltage drop values for lamps L1 L2, and L3 respectively. In each circuit represented by FIGS. 13A-13E, an AC voltage V' is applied to the lamp group, and the corresponding digital voltage is V. Phases øA and øB indicate that the power source is three phase AC, and the lamp series is connected across the line-to-line voltage of these two phases. As mentioned previously for the two lamp case, and for similar reasons, a zero voltage drop across a lamp implies that no current is flowing through the lamp, and not that the lamp is completely shorted.

Figure 13A:
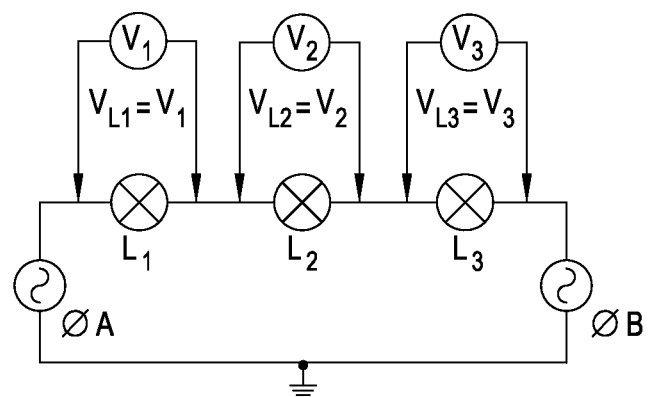
FIGS. 13A-13E are schematic views depicting lamp operation.

FIG. 13A shows the state where all lamps are in a normal operating state. The voltage across L1 has a nonzero value $V_1$, the voltage across L2 has a nonzero value $V_2$, and the voltage across L3 has nonzero value $V_3$. The condition of normal operation for all lamps can be expressed as follows: If each lamp in the series has a nonzero voltage value, and the magnitudes of the voltage differences between adjacent lamp pairs are less than or equal to some threshold value, then all the lamps are normal. For example, if $|V_{L1}-V_{L2}| \leq \alpha$ and $|V_{L2}-V_{L3}| \leq \alpha$, then lamps L1, L2, and L3 are normal. In other embodiments, the failure detection method may also include the magnitudes of the voltage differences between non-adjacent lamp pairs. For example, if $|V_{L1}-V_{L3}| \leq \alpha$, then lamps L1 and L3 are normal. As in the two lamp case, $\alpha$ represents a differential voltage threshold value which is used to define a state of normal lamp operation. This threshold value is typically selected based on experience with types of lamps used and variations allowable. In the case of RTP, the allowable threshold may be less than 5 percent of the average voltage across each lamp. If two adjacent lamps in the series have nonzero voltage values, and the magnitude of the voltage difference for this pair is greater than this threshold value, then the lamps are not in a normal operating state, and a failure state can be defined for the lamp pair. For example, if $|V_{L1}-V_{L2}| > \alpha$, then lamps L1 and L2 are not in a normal operating state and a failure state can be defined for the lamp pair.

Figure 13B:
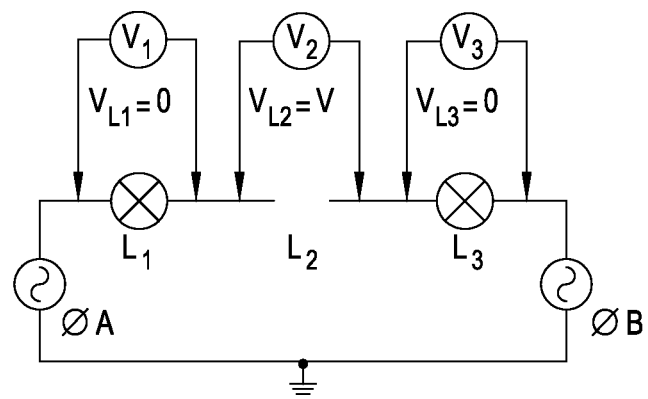

In FIG. 13B, lamp L2 is in an open state and all other lamps are in a closed state. An open state indicates that the internal lamp circuit is open and no current can flow through the lamp. The voltages across L1 and L3 are zero since there is no longer a complete circuit to allow current flow through the lamps. But since all the lamps are closed except for L2, the voltage measured across L2 will now have the value V which is the voltage applied to the three-lamp series. This condition can be generalized to three or more lamps in series, and expressed as: If all lamp voltages are zero except for one lamp that has a nonzero voltage, then the lamp with the nonzero voltage is open, has a voltage drop V, and all other lamps in the series are closed. A failure state for the open lamp exists, and a signal can be sent to a display screen to identify which lamp in the series has failed.

Figure 13C:
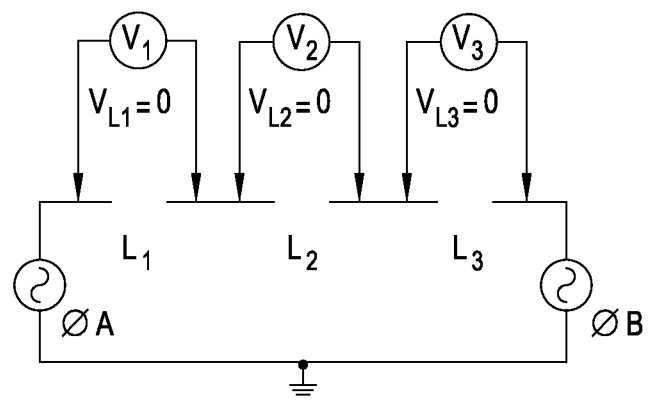
Figure 13D:
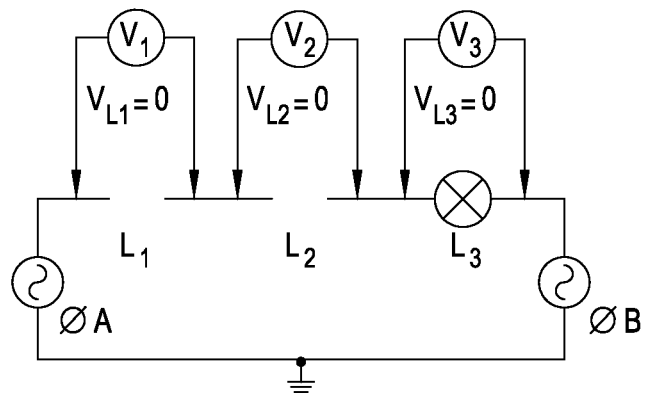

In FIG. 13C, all lamps are in an open state. As mentioned earlier, for some embodiments, the DAQ may be designed in the event of open circuits to provide zero voltage readings, as shown in FIGS. 13C and 13D. In this case, the voltages across each lamp are zero when all lamps are open, and a nonzero voltage value can only be obtained if a voltage measurement is made across the lamp series, in which case the value would be V. In other embodiments, the lamp failure detection system may be designed to indicate that an open circuit has been detected when all lamps are open, and not provide zero voltage readings. In FIG. 13D, only two lamps, L1 and L2, are open. When the series consists of three or more lamps, and more than one lamp is open, there may be insufficient information using only voltage drops across individual lamps to determine which lamps are open and which are not. The conditional in this case becomes: For three or more lamps in series, if the voltage drop across each lamp of the series is zero, then two or more lamps are in an open state.

Figure 13E:
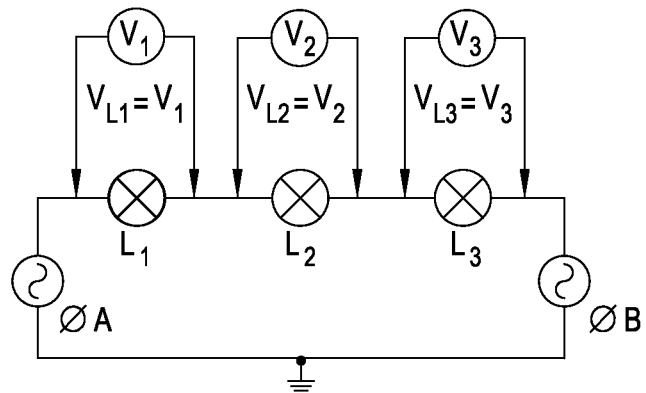

Another failure state is possible for the lamp series. FIG. 13E shows the case where lamp L2 has a partial internal short, and all the other lamps are normal. In this case none of the lamps are in an open state, and each lamp will have a nonzero voltage drop. It can be appreciated that a partial short in lamp L2 will reduce the lamp resistance below its normal value, and this will cause a decrease in the voltage drop across lamp L2. This observation suggests that a partial internal short in one lamp will increase the difference between voltage drops for each lamp beyond the value one would expect for normal lamp operation. This state can be represented by a conditional where the difference in voltages $V_{L1}$ and $V_{L2}$ are compared to a threshold value. If this difference exceeds the threshold value, then an unacceptable partial short condition is identified for lamp L2 and a failure state exists. This conditional can be expressed as: If all lamp voltages are nonzero, and $(V_{L1}-V_{L2}) > \Delta$, then lamp L2 has a partial short. Note that in the case of three or more lamps, the other adjacent lamp could be used to test if lamp L2 has a short. Specifically, if $(V_{L3}-V_{L2}) > \Delta$, then L2 would also be identified as having a short. The same methodology can be applied to any lamp in the series to test if the lamp is short. Additionally, the if-then statement can be further shortened to: If $(V_{L1}-V_{L2}) > \Delta$, then lamp L2 has a partial short. In other embodiments, the failure detection method may also include the magnitudes of the voltage differences between non-adjacent lamp pairs. For example, if $(V_{L1}-V_{L3}) > \Delta$, then lamp L3 has a partial short. As before, the choice of threshold value A will depend on the allowable variation in lamp intensities, but may be less than 8 percent of the average voltage across each lamp for application to RTP.

Figure 14:
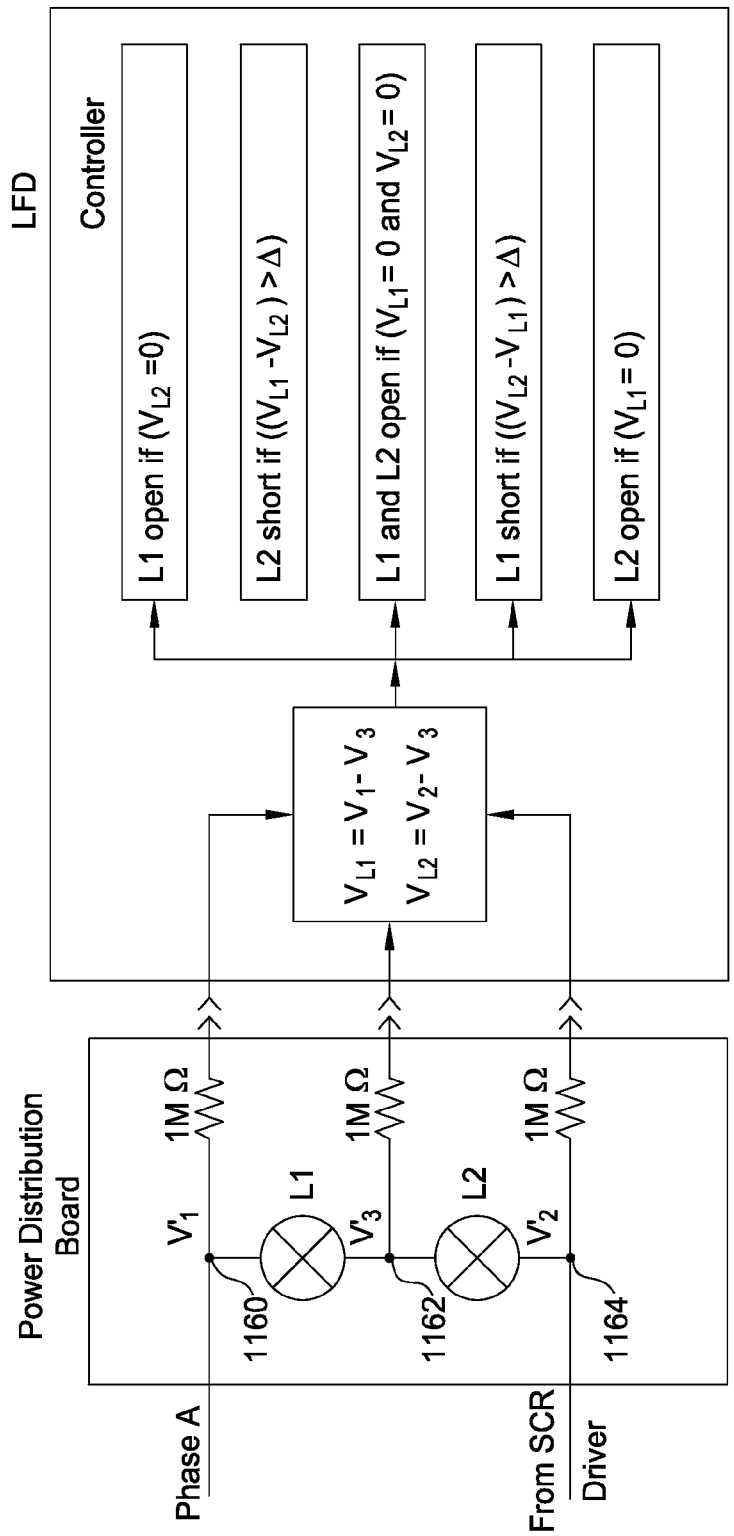
FIG. 14 is a schematic depiction of one embodiment of a lamp failure detection apparatus.

FIG. 14 is a schematic representation of the electronic components used to detect lamp failure for two lamps connected in series. An SCR driver may be connected to a power distribution board that contains all the lamps in the lamphead. In this example, only a single pair is shown. All the lamps in the lamphead are divided into radially symmetric zones, and each zone is connected to a separate SCR driver so that power can be adjusted to each zone. Each zone is divided into lamp pairs, and each pair is connected to a failure detection system. One such lamp pair L1 and L2 is shown here.

The power distribution board has conducting lines that connect to points on either side of each lamp so that voltage measurements can be made at points on either side of the lamps. $V'_1$, $V'_2$, and $V'_3$ represent the analog voltages at points 1160, 1162, and 1164 respectively, and $V_1$, $V_2$, and $V_3$ represent the corresponding digital values. Each conducting line has a ballast resistor of approximately 1 Mega-ohm. Although the present embodiment shows a ballast resistor of about 1 Mega-ohm, other resistance values may be used. In this embodiment, ballast resistors are included in the power distribution board, but may be included in the lamp failure detection (LFD) board in other embodiments.

The lamp failure detection (LFD) board includes a DAQ module and a controller module. The controller calculates the voltage drops across each lamp using the digital voltage values $V_1$, $V_2$, and $V_3$. The voltage drop across L1 is $V_{L1}=V_1-V_3$; the voltage drop across L2 is $V_{L2}=V_2-V_3$. Then the controller applies the conditionals shown in the figure to determine if a lamp failure state exists. If a lamp is open or has an internal short, the controller sends a signal to a user interface device that will allow the failure state to be detected and the failed lamp to be identified. In the present embodiment, as shown in FIG. 14, the lamp failure detection system is designed in the event of open circuits to provide zero voltage readings. In other embodiments, the system may only indicate that an open circuit has been detected, in which case the conditional for all lamps open as shown in FIG. 14 may no longer be relevant.

Figure 15A:
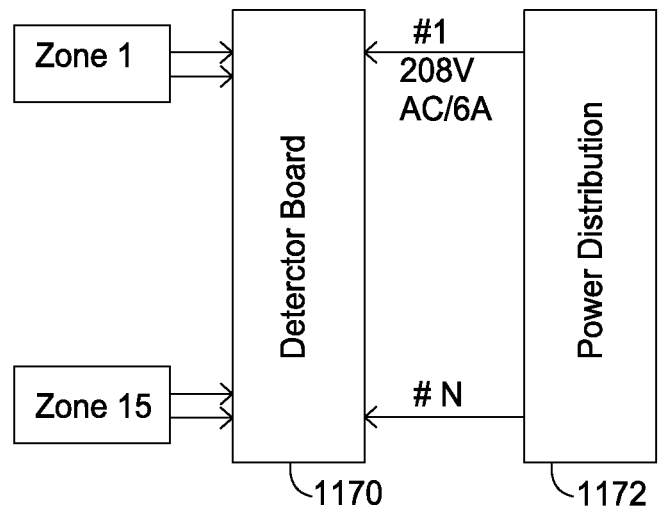
FIG. 15A is a schematic view of a prior art lamp failure detection apparatus.
Figure 15B:
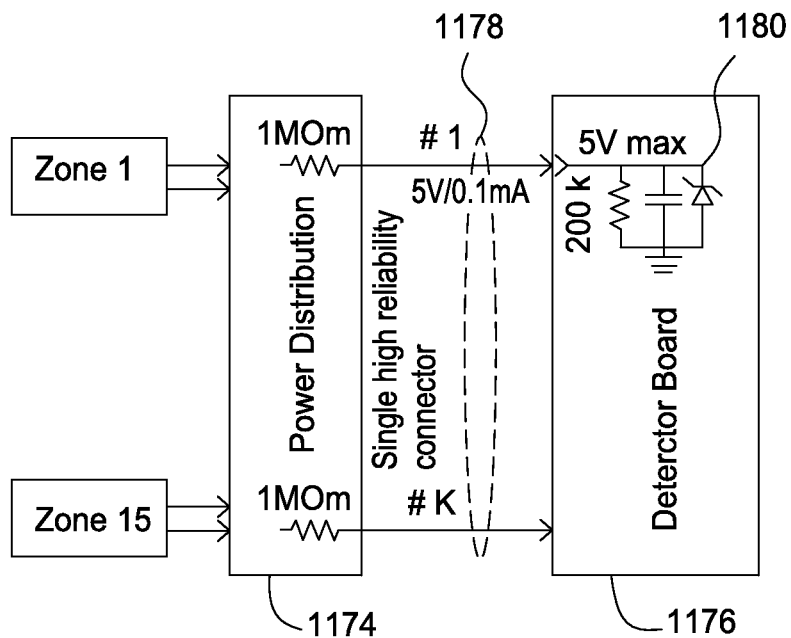
FIG. 15B is a schematic view of another embodiment of a lamp failure detection apparatus.

FIG. 15A is a schematic view of a prior art lamp failure detection apparatus, and FIG. 15B is a view of an embodiment of the present disclosure. A comparison of both figures shows the differences in connection methods between the LFD board and the power distribution board. Fifteen zones are shown, and each zone contains an SCR driver. Although 15 zones are shown in FIG. 15B, a different number of zones may be used in other embodiments of the present disclosure. In the prior art example, each zone and the associated driver are connected to the lamp failure detection (LFD) board 1170, and the LFD board is connected to the power distribution (PD) board 1172. The connection of the LFD board 1170 to the PD board 1172 requires the alignment of many different connectors, and this is a time consuming process. Also, this configuration requires that the LFD board 1170 be present before any power can be delivered to the PD board 1172 and lamps therein. Referring to FIG. 15B, the present embodiment shows a different connection configuration. The SCR driver in each zone is connected directly to the PD board 1174 so that the PD board 1174 and lamps therein can be operational without the LFD board 1176. A single connector 1178 will allow the PD board 1174 and LFD board 1176 to be connected together, greatly simplifying the connection of the two boards. In addition, the voltage signals received by the LFD board 1176 will be to about 5V and about 0.1 mA due to the ballast resistor of approximately 1 Mega-Ohm. A filter circuit 1180 may limit the signal voltage to about 5V maximum which is seen by the LFD board.

Figure 16:
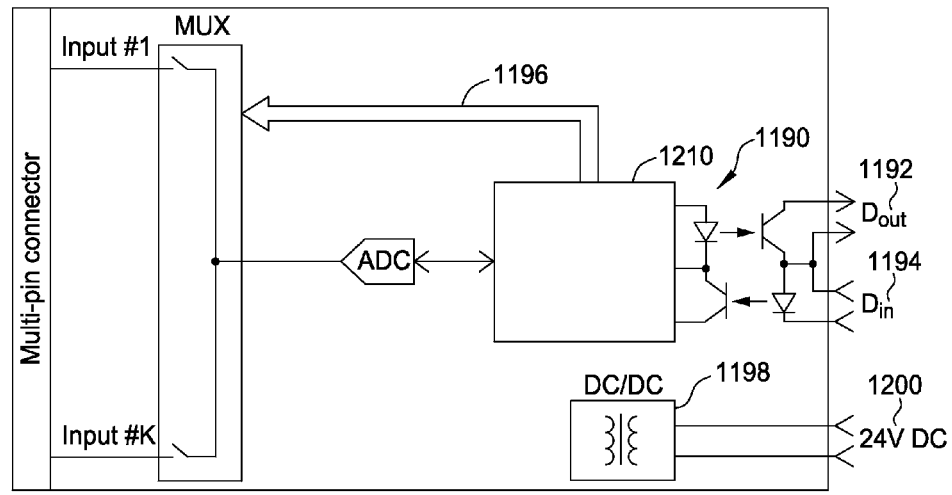
FIG. 16 is a schematic representation of an embodiment for a lamp failure detector board.

In FIG. 16, the structure of an embodiment of a LFD board of the present disclosure is shown in more detail. A multi-pin connector (such as electrical connectors 906a, 906b shown in FIGS. 9A and 9B) will allow the LFD board to connect to the power distribution board. Voltage signals from each lamp pair in each lamp zone will be input into a multiplexer (MUX) which will sample these signals as instructed via a communication channel 1196 by a processor 1210. The ADC will convert the analog signals to digital values that will be sent to a processor 1210. In the present embodiment, a field programmable gate array (FPGA) is used for the processor, but other processors may be used. The FPGA may calculate the voltage drops across each lamp of each lamp pair. The FPGA will be pre-programmed with the lamp failure conditionals, and will apply these conditionals to determine if a lamp is in an open state or has an internal short. A DC/DC converter 1198 is shown as part of the LFD board. A 24V DC power input 1200 will be stepped down by the DC to DC converter to provide power to the LFD components. Input/output circuitry 1190 will allow communication with the FPGA, as represented by data in $D_{IN}$ 1194 and data out $D_{OUT}$ 1192.

In the preceding embodiments of the present disclosure, two or more lamps in series have been considered. In some applications, it may be desirable or necessary to connect only one lamp across a power supply. For example, if the total number of lamps in the lamphead is an odd number, but lamp pairs are to be used as the basic series unit for each failure detection circuit, then a single lamp would remain unpaired. The failure detection method using voltage drops across each lamp cannot be used in the single lamp case unless the detection circuit is slightly modified, or an alternate method is used. The following lamp failure detection method deals with this single lamp case.

Figure 17:
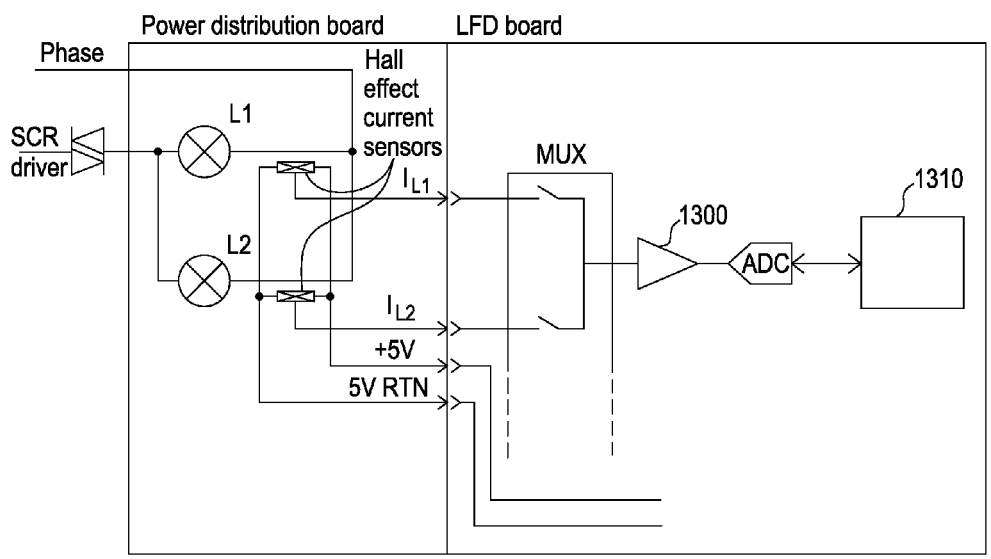
FIG. 17 depicts another embodiment of lamp failure detection system.

FIG. 17 shows how a lamp failure detection method may be used in the case where a lamp cannot be placed in series with one or more additional lamps. Two lamps L1 and L2 are connected in parallel to a power supply, such as the SCR driver shown which may represent one zone of a plurality of radially symmetric zones in the lamphead. Each lamp is singly connected across the power supply. Hall effect current sensors are located in proximity to each lamp within the power distribution board. Current output signals $I_{L1}$ and $I_{L2}$ are sent to an LFD board and multiplexer (MUX) which can sample the signals and send them to an ADC to convert the analog signals to digital. The digital signals can then be sent to a processor 1310, such as a field programmable gate array (FPGA), which can apply an if-then statement to the current signals to determine if lamp L1 or L2 is in a failure state. The if-then statement may simply be a threshold current value $\beta$ that is compared to the current signal of each lamp. For example, if $I_{L1}<\beta$, then a failure state may exist for lamp L1. Since the current output signals may be very weak, one or more amplifiers 1300 may be included in the LFD board to boost the signals, and the lamp failure if-then statement may be applied to the amplified signal.

Figure 18:
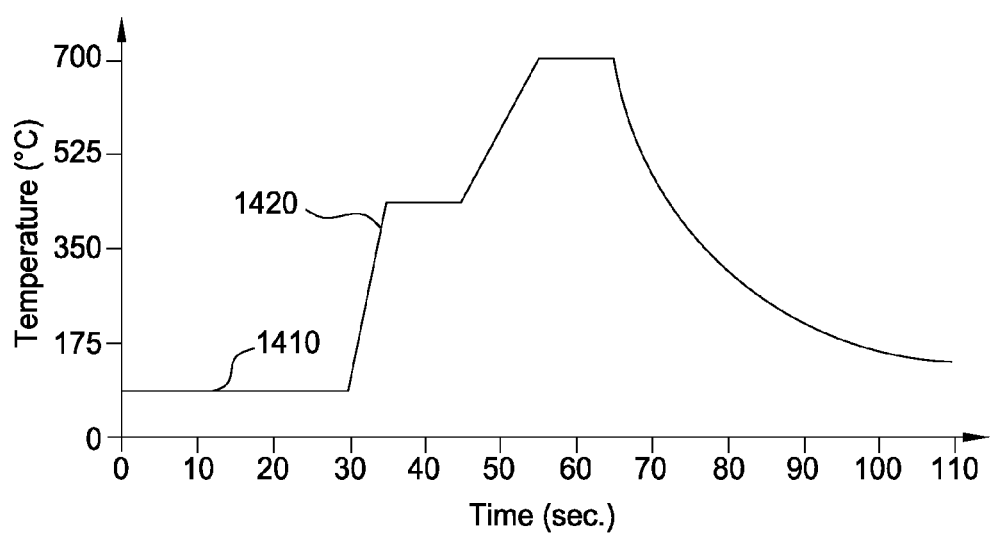
FIG. 18 shows a typical time versus temperature curve for a rapid thermal processing (RTP) system.

FIG. 18 shows a typical RTP time versus temperature curve. The temperature plateau 1410 represents lamps which are energized but at a very low power setting, just prior to the start of an RTP cycle. The start of the RTP cycle is represented by the temperature ramp 1420. The detection method for open lamps may be applied at such a temperature plateau 1410, or during a very slow temperature ramp. The lamp failure detection apparatus can check each lamp of the lamphead for an open state in a sufficiently short time interval to allow application of the detection method just prior to start of the RTP cycle for each RTP chamber. Failure detection for lamps which may be shorted may be performed at less frequent intervals, possibly once or twice per day, and when there would be no impact to chamber throughput. In other embodiments, the lamp failure detection method could be performed during scheduled maintenance of the RTP system.

The lamp failure detection method may also be used to adjust thermal processing parameters for substrate processing based on lamp failure information. In one embodiment, the detection method for shorted or open lamp states may be performed during substrate processing for those lamp zones most sensitive to variations in lamp intensity, and corresponding lamp power adjustments made using lamp failure signals in order to compensate for the effects of failed lamps. In other embodiments, the power to different lamp zones may be changed, or different process parameters may be changed before, during, or after substrate processing to compensate for failed lamps.

Benefits of the present disclosure include an easy, fast replacement of a lamp without moving the entire lamphead assembly by providing an opening in a power distribution assembly for the lamphead assembly. The opening is sized to allow the passage of the lamp through the power distribution assembly. In addition, the present disclosure also provides a lamp failure detection method which avoids reducing RTP system throughput and minimize system downtime by checking only for open lamps at different times just prior to the start of the RTP cycle for each RTP chamber. Checking only for open lamps would take less time than checking for both open and shorted lamps, but open lamps will typically have a greater impact on radiation uniformity than lamps which are only partially shorted.

While the foregoing is directed to embodiments of the present disclosure, other and further embodiments of the disclosure may be devised without departing from the basic scope thereof, and the scope thereof is determined by the claims that follow.

What is claimed is:

1. A lamphead assembly, comprising:
   a plurality of lamps for emitting radiant energy;
   a plurality of lamp adapters, wherein each of the plurality of lamps is attached to a respective lamp adapter; and
   a power distribution assembly having a plurality of openings, wherein the power distribution assembly removably couples to the plurality of lamp adapters and is operable to provide power to each lamp through each lamp adapter, and each opening of the plurality of openings is sized to allow passage of one lamp therethough, and wherein the plurality of lamp adapters have heights gradually increased in a radially outward direction from a center of the power distribution assembly to an edge of the power distribution assembly.

2. The lamphead assembly of claim 1, wherein the power distribution assembly is a single flat circuitry board having multiple concentric circular regions of increasing diameter, and each circular region contains one or more of said openings.

3. The lamphead assembly of claim 1, wherein the lamps have heights gradually increased in a radially outward direction from a center of the power distribution assembly to an edge of the power distribution assembly.

4. The lamphead assembly of claim 1, wherein the power distribution assembly is consisted of multiple concentric ring-type circuitry boards at different elevations, and each ring-type circuitry board contains one or more of said openings.

5. The lamphead assembly of claim 4, wherein the elevation of the multiple concentric ring-type circuitry boards is gradually increased in a radially outward direction from a center of the power distribution assembly to an edge of the power distribution assembly.

6. The lamphead assembly of claim 1, wherein each lamp adapter has electrical contact elements in electrical communication with electrical contact terminals formed within the opening.

7. The lamphead assembly of claim 6, wherein the electrical contact element comprises two contact leads extending symmetrically and outwardly from a bottom of the lamp adapter.

8. The lamphead assembly of claim 7, wherein the electrical contact terminals are in electrical communication with an electrically-conductive receptacle formed in an interior circumferential surface of the opening.

9. The lamphead assembly of claim 1, wherein the plurality of lamps are disposed below a lower dome of a substrate process chamber.

10. The lamphead assembly of claim 8, wherein the electrically-conductive receptacle receives the contact leads in a snap-fit or twist-lock engagement, and the electrically-conductive receptacle is operable to electrically connect the plurality of lamps to a power source through the plurality of lamp adapters.

11. A lamphead assembly, comprising:
    a plurality of lamps for emitting radiant energy;
    a plurality of lamp adapters, wherein each of the plurality of lamps is attached to a respective lamp adapter; and
    a power distribution assembly having a plurality of openings, wherein the power distribution assembly removably couples to the plurality of lamp adapters and is operable to provide power to each lamp through each lamp adapter, and each opening of the plurality of openings is sized to allow passage of one lamp therethough, and wherein the lamps have heights gradually increased in a radially outward direction from a center of the power distribution assembly to an edge of the power distribution assembly.

12. The lamphead assembly of claim 11, wherein the power distribution assembly is a single flat circuitry board having multiple concentric circular regions of increasing diameter, and each circular region contains one or more of said openings.

13. The lamphead assembly of claim 11, wherein the power distribution assembly is consisted of multiple concentric ring-type circuitry boards at different elevations, and each ring-type circuitry board contains one or more of said openings.

14. The lamphead assembly of claim 13, wherein the elevation of the multiple concentric ring-type circuitry boards is gradually increased in a radially outward direction from a center of the power distribution assembly to an edge of the power distribution assembly.

15. The lamphead assembly of claim 11, wherein each lamp adapter has electrical contact elements in electrical communication with electrical contact terminals formed within the opening.

16. The lamphead assembly of claim 15, wherein the electrical contact element comprises two contact leads extending symmetrically and outwardly from a bottom of the lamp adapter.

17. The lamphead assembly of claim 16, wherein the electrical contact terminals are in electrical communication with an electrically-conductive receptacle formed in an interior circumferential surface of the opening.

18. The lamphead assembly of claim 11, wherein the plurality of lamps are disposed below a lower dome of a substrate process chamber.

19. The lamphead assembly of claim 17, wherein the electrically-conductive receptacle receives the contact leads in a snap-fit or twist-lock engagement, and the electrically-conductive receptacle is operable to electrically connect the plurality of lamps to a power source through the plurality of lamp adapters.

20. A lamphead assembly, comprising:
    a plurality of lamps for emitting radiant energy;
    a plurality of lamp adapters, wherein each of the plurality of lamps is attached to a respective lamp adapter; and
    a power distribution assembly having a plurality of openings, wherein the power distribution assembly removably couples to the plurality of lamp adapters and is operable to provide power to each lamp through each lamp adapter, and each opening of the plurality of openings is sized to allow passage of one lamp therethough, and wherein the power distribution assembly is consisted of multiple concentric ring-type circuitry boards at different elevations, and each ring-type circuitry board contains one or more of said openings.

* * * * *